United States Patent
Ikeda et al.

(10) Patent No.: US 8,171,210 B2
(45) Date of Patent: May 1, 2012

(54) SEMICONDUCTOR MEMORY, OPERATING METHOD OF SEMICONDUCTOR MEMORY, AND SYSTEM

(75) Inventors: Hitoshi Ikeda, Kawasaki (JP); Takahiko Sato, Kawasaki (JP); Tomohiro Kawakubo, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 729 days.

(21) Appl. No.: 12/235,353

(22) Filed: Sep. 22, 2008

(65) Prior Publication Data

US 2009/0089493 A1    Apr. 2, 2009

(30) Foreign Application Priority Data

Sep. 27, 2007   (JP) ................................. 2007-251427

(51) Int. Cl.
*G06F 13/14*    (2006.01)
(52) U.S. Cl. .......... 711/105; 365/203; 710/49; 711/106; 711/167
(58) Field of Classification Search .................. 711/105, 711/106, 167; 710/49; 365/203
See application file for complete search history.

(56) References Cited

U.S. PATENT DOCUMENTS

| | | | |
|---|---|---|---|
| 5,499,211 A * | 3/1996 | Kirihata et al. | 365/203 |
| 5,598,569 A * | 1/1997 | Catherwood et al. | 714/1 |
| 5,999,472 A | 12/1999 | Sakurai | |
| 6,222,846 B1 * | 4/2001 | Bonola et al. | 370/402 |
| 6,842,423 B1 * | 1/2005 | Erimli et al. | 370/235 |
| 2001/0018726 A1 * | 8/2001 | Tabo | 711/106 |
| 2002/0060940 A1 * | 5/2002 | Tomita | 365/222 |
| 2003/0081483 A1 * | 5/2003 | De Paor et al. | 365/222 |
| 2007/0195627 A1 * | 8/2007 | Kim | 365/222 |

FOREIGN PATENT DOCUMENTS

| | | |
|---|---|---|
| JP | 08-036883 A | 2/1996 |
| JP | 11-045570 A | 2/1999 |
| JP | H11-66843 A | 3/1999 |
| JP | 2000-331475 A | 11/2000 |

* cited by examiner

*Primary Examiner* — Jae Yu
(74) *Attorney, Agent, or Firm* — Arent Fox LLP

(57) ABSTRACT

Operation control circuits start a first operation of any of memory cores in response to a first operation command, start a second operation of any of the memory cores in response to a second operation command, and terminate the first operation and continue the second operation in response to a termination command to terminate operations of the plurality of memory cores. For example, the semiconductor memory is mounted on a system together with a controller accessing the semiconductor memory. The termination of the operation in response to the termination command is judged in accordance with an operation state of the memory core. Accordingly, it is possible to terminate the operation of the memory core requiring the termination of operation without specifying the memory core from outside.

12 Claims, 30 Drawing Sheets

| command | /CS | /RAS | /CAS | /WE | AP | BA | ADD | command signal |
|---|---|---|---|---|---|---|---|---|
| ACTV | L | L | H | H | X | V | V(RAD) | ACTPZ |
| RD | L | H | L | H | L | V | V(CAD) | RDPZ |
| WR | L | H | L | L | L | V | V(CAD) | WRPZ |
| REF | L | L | L | H | X | X | X | REFPZ |
| PRE | L | L | H | L | L | V | X | PREPZ |
| PALL | L | L | H | L | H | X | X | PALPZ |
| MRS | L | L | L | L | L | L | V | MRSPZ |

Fig. 5

| command | /CS | /RAS | /CAS | /WE | AP | BA | ADD | SP | command signal |
|---|---|---|---|---|---|---|---|---|---|
| ACTV | L | L | H | H | X | V | V(RAD) | X | ACTPZ |
| RD | L | H | L | H | L | V | V(CAD) | X | RDPZ |
| WR | L | H | L | L | L | V | V(CAD) | X | WRPZ |
| REF | L | L | L | H | X | X | X | X | REFPZ |
| PRE | L | L | H | L | L | V | X | L | PREPZ |
|  | L | L | H | L | L | V | X | H | MPREPZ |
| PALL | L | L | H | L | H | X | X | X | PALPZ |
| MRS | L | L | L | L | L | L | V | X | MRSPZ |

Fig. 17

| command | /CS | /RAS | /CAS | /WE | AP | BA | ADD | SP | command signal |
|---|---|---|---|---|---|---|---|---|---|
| ACTV | L | L | H | H | X | V | V(RAD) | X | ACTPZ |
| RD | L | H | L | H | L | V | V(CAD) | X | RDPZ |
| WR | L | H | L | L | L | V | V(CAD) | X | WRPZ |
| REF | L | L | L | H | X | X | X | X | REFPZ |
| PRE | L | L | H | L | L | V | X | X | PREPZ |
| PALL | L | L | H | L | H | X | X | L | PALPZ |
| | | | | | | | | H | MPREPZ |
| MRS | L | L | L | L | L | L | V | X | MRSPZ |

Fig. 18

| command | /CS | /RAS | /CAS | /WE | AP | BA | ADD | SP | command signal |
|---|---|---|---|---|---|---|---|---|---|
| ACTV | L | L | H | H | X | V | V(RAD) | X | ACTPZ |
| RD | L | H | L | H | L | V | V(CAD) | X | RDPZ |
| WR | L | H | L | L | L | V | V(CAD) | X | WRPZ |
| REF | L | L | L | H | X | X | X | X | REFPZ |
| PRE | L | L | H | L | L | V | X | L | PREPZ |
| | | | | | | | | H | MPREPZ |
| PALL | L | L | H | L | H | X | X | L | PALPZ |
| | | | | | | | | H | MPREPZ |
| MRS | L | L | L | L | L | L | V | X | MRSPZ |

Fig. 19

| command | /CS | /RAS | /CAS | /WE | BA | AP | ADD | command signal |
|---|---|---|---|---|---|---|---|---|
| ACTV | L | L | H | H | V | X | V(RAD) | ACTPZ |
| RD | L | H | L | H | V | L | V(CAD) | RDPZ |
| RDA | L | H | L | H | V | H | V(CAD) | RDAPZ |
| WR | L | H | L | L | V | L | V(CAD) | WRPZ |
| WRA | L | H | L | L | V | H | V(CAD) | WRAPZ |
| REF | L | L | L | H | X | X | X | REFPZ |
| PRE | L | L | H | L | V | L | X | PREPZ |
| PALL | L | L | H | L | X | H | X | PALPZ |
| MRS | L | L | L | L | L | L | V | MRSPZ |

SEMICONDUCTOR MEMORY, OPERATING METHOD OF SEMICONDUCTOR MEMORY, AND SYSTEM

CROSS REFERENCE TO RELATED APPLICATION

This application is based upon and claims the benefit of priority from Japanese Patent Application No. 2007-251427, filed on Sep. 27, 2007, the entire contents of which is incorporated herein by reference.

BACKGROUND

1. Field

The present embodiments relate to a semiconductor memory and a system on which the semiconductor memory is mounted.

2. Description of the Related Art

A semiconductor memory such as an SDRAM having a plurality of banks (memory cores) has a single precharge command precharging one bank specified by a bank address, and an all-precharge command precharging all banks (for example, Japanese Laid-open Patent Publication No. H11-45570). Further, a method is proposed in which a plurality of banks specified by bits of an external address signal are precharged (for example, Japanese Laid-open Patent Publication No. H08-36883). A precharge command is a termination command terminating operations of a memory core.

When the bank to be precharged is specified by using the external address signal, the precharge command is identified by including an address signal in addition to command signals such as a chip select signal and a row address strobe signal. Accordingly, there is a problem in which a compatibility with a semiconductor memory operating by a general precharge command is lost, and circuits such as a controller accessing the semiconductor memory has to be changed. Further, when each bank is arbitrary precharged, the number of bits of a signal line to specify the bank to be precharged increases. For example, when the number of banks is larger than the number of address terminals, there is a problem in which a bank to be precharged cannot be specified. The bank to be precharged and the bank not to be precharged are determined depending on an operation state of the bank. Accordingly, a circuit to arbitrary precharge all combinations of banks is not necessary.

SUMMARY

According to an aspect of an embodiment, a semiconductor memory includes a plurality of memory cores having memory cells and operation control circuits. The operation control circuits start a first operation of any of the memory cores in response to a first operation command, start a second operation of any of the memory cores in response to a second operation command, and terminate the first operation and continue the second operation in response to a termination command to terminate operations of the plurality of memory cores.

BRIEF DESCRIPTION OF THE DRAWINGS

FIG. 5 illustrates a command specification of a memory illustrated in FIG. 1.
FIG. 17 illustrates a command specification of a semiconductor memory illustrated in FIG. 15.
FIG. 18 illustrates a command specification of a semiconductor memory in another embodiment.
FIG. 19 illustrates a command specification of a semiconductor memory in still another embodiment.
FIG. 22 illustrates a command specification of a semiconductor memory illustrated in FIG. 20.
FIG. 23 illustrates an example of a memory map of the semiconductor memory illustrated in FIG. 20.

DETAILED DESCRIPTION OF THE EMBODIMENTS

Figure 1:
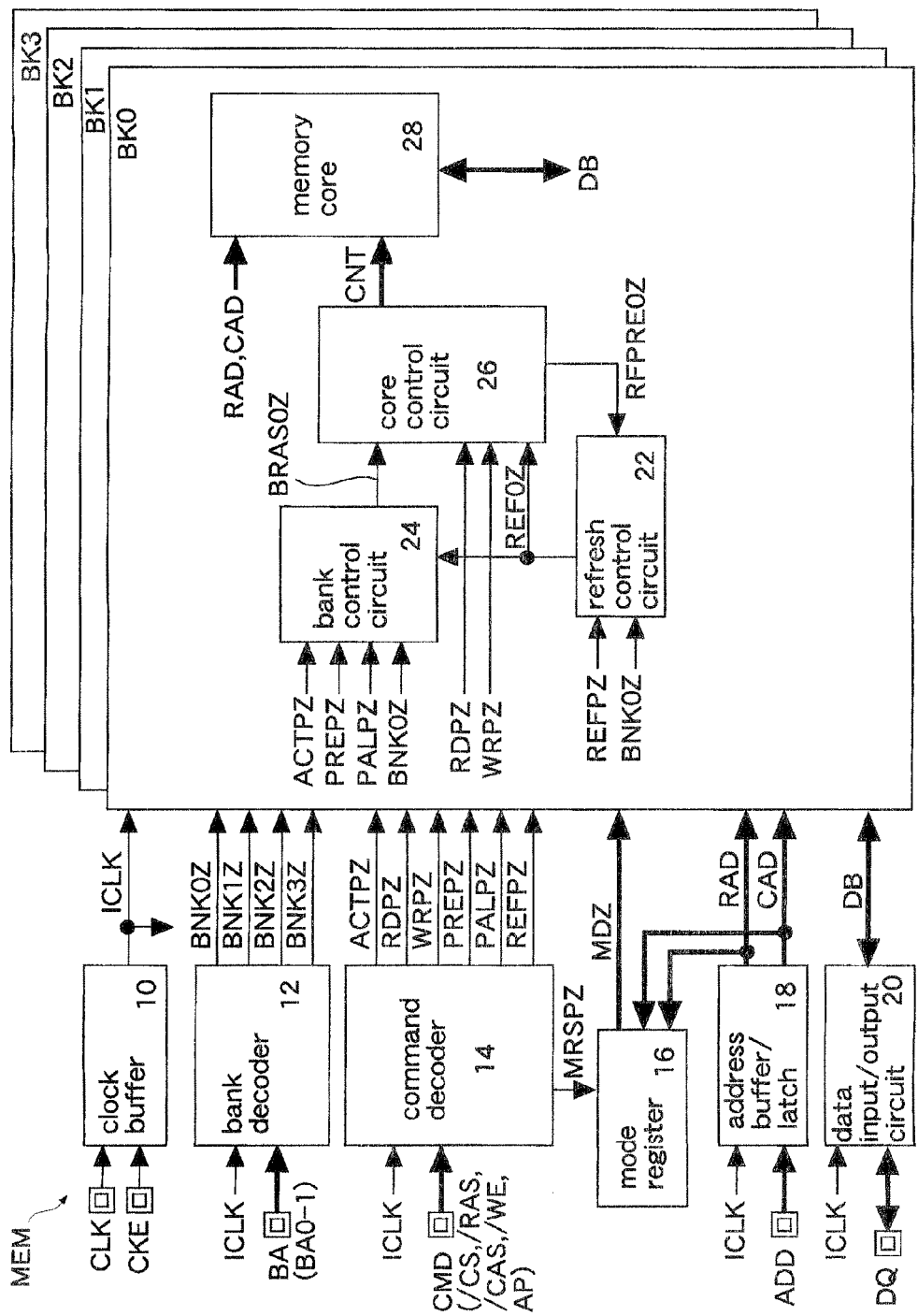
FIG. 1 illustrates an embodiment.

Hereinafter, embodiments are described by using the drawings. Twofold square marks in the drawing represent external terminals. The external terminals are, for example, a pad on a semiconductor chip, or a lead of a package in which the semiconductor chip is housed. A symbol which is the same as a terminal name is used for a signal supplied via the external terminal. A symbol which is the same as a signal name is used for a signal line in which the signal is transmitted. A signal having "/" at a beginning shows a negative logic. A signal having "Z" at an end shows a positive logic. A signal having "PZ" at the end is a positive pulse signal.

FIG. 1 illustrates an embodiment. A semiconductor memory MEM is, for example, an SDRAM. The SDRAM has dynamic memory cells, and operates in synchronization with a clock signal CLK. The memory MEM has a clock buffer 10, a bank decoder 12, a command decoder 14, a mode register 16, an address buffer/latch 18, a data input/output circuit 20, and four banks BK0-3. Each of the banks BK0-3 has a refresh control circuit 22, a bank control circuit 24, a core control circuit 26 and a memory core 28. The refresh control circuit 22, the bank control circuit 24 and the core control circuit 26 operate as operation control circuits and access control circuits executing access operations (an activation operation, a read operation, a write operation and a refresh operation) of the memory core 28.

The clock buffer 10 outputs the clock signal CLK as an internal clock signal ICLK during a high level period of a clock enable signal CKE. The clock buffer 10 terminates the output of the internal clock signal ICLK during a low level period of the clock enable signal CKE to reduce a power consumption of the memory MEM. The internal clock signal ICLK is supplied to circuits operating in synchronization with clock signals such as the command decoder 14, the address buffer/latch 18, the data input/output circuit 20, the banks BK0-3, and so on. Incidentally, the clock buffer 10 may constantly output the internal clock signal ICLK without receiving the clock enable signal CKE.

The bank decoder 12 outputs a bank signal BNKZ (any of BNK0Z-BNK3Z) in accordance with bank address signals BA (BA0, BA1) in two bits. The bank signals BNK0Z-BNK3Z are respectively activated into high level when the banks BK0-3 are selected. Incidentally, when the memory MEM has eight banks BK0-7, the bank decoder 12 decodes the bank address signals BA0-2 in three bits.

The command decoder 14 latches a command signal CMD in synchronization with a rising edge of the internal clock signal ICLK, decodes the latched signal, and outputs an activation command signal ACTPZ (a first operation command) to access the banks BK-3, a read command signal RDPZ, a write command signal WRPZ, a precharge command signal PREPZ, an all-precharge command signal PALPZ (a termination command), a refresh command signal REFPZ (a second operation command), and a mode register set signal MRSPZ to set the mode register 16. The command signal CMD includes a chip select signal /CS, a row address strobe signal /RAS, a column address strobe signal /CAS, a write enable signal /WE and an auto-precharge signal AP. For example, the command decoder 14 operates as a command input circuit receiving an activation command ACT to set each memory core 28 into an activated state, a refresh command REF to execute a refresh operation refreshing memory cells MC of each memory core 28, and an all-precharge command PALL to inactivate every memory core 28 in activated state and to terminate the operations, as they are described later. Functions of the command decoder 14 (a command specification of the memory MEM) are illustrated in FIG. 5.

The mode register 16 is synchronized with the mode register set signal MRSPZ, receives a row address signal RAD and a column address signal CAD, and sets values of the received address signals RAD, CAD into a housed register to set an operation mode. The mode register 16 outputs the set value of the register as a mode signal MDZ. For example, a burst length, data latency, and so on are set by the mode register 16. The burst length is the number of output times of data signals output from a data terminal DQ in response to one time read command (RDPZ), and the number of input times of the data signals received at the data terminal DQ in response to one time write command (WRPZ). The data latency is the number of clock cycles from the time when the read command is received until the first read data signal DQ is output. Incidentally, the memory MEM may not have the mode register 16 when the operation mode of the memory MEM is only one, and the burst length and the data latency are constant.

The address buffer/latch 18 is synchronized with the rising edge of the internal clock signal ICLK, latches an address signal ADD, and outputs the latched signal as the row address signal RAD and the column address signal CAD. The row address signal RAD is supplied to select later-described word lines WL. The column address signal CAD is supplied to select later-described bit lines BL, /BL. This memory MEM is a memory of an address multiplex type in which the row address signal RAD and the column address signal CAD are supplied to a common address terminal AD at different timings from one another.

The data input/output circuit 20 latches the data signal DQ in synchronization with the rising edge of the internal clock signal ICLK, and outputs the latched signal to a data bus DB. The data input/output circuit 20 is synchronized with the internal clock signal ICLK, and outputs a read data signal on the data bus DB as the data signal DQ.

The refresh control circuit 22 activates or inactivates a refresh signal REF0Z to execute the refresh operation of the memory core 28 in accordance with the refresh command signal REFPZ, the bank signal BNK0Z, and a refresh end signal RFPRE0Z (a refresh precharge signal). The bank control circuit 24 activates or inactivates a basic timing signal BRAS0Z (an access signal) to execute the activation operation, the read operation, the write operation and the refresh operation of the memory core 28 in accordance with the command signals ACTPZ, PREPZ, PALPZ, the bank signal BNK0Z and the refresh signal REF0Z.

The core control circuit 26 outputs a control signal CNT to the memory core 28 to set the memory core 28 into an activated state (namely, to execute the activation operation) when the basic timing signal BRAS0Z is received without receiving the read command signal RDPZ, the write command signal WRPZ and the refresh signal REF0Z. The core control circuit 26 outputs the control signal CNT to the memory core 28 to execute the read operation when the read command signal RDPZ is received during an activation period of the basic timing signal BRAS0Z. The core control circuit 26 outputs the control signal CNT to the memory core 28 to execute the write operation when the write command signal WRPZ is received during the activation period of the basic timing signal BRAS0Z. The core control circuit 26 outputs the control signal CNT to the memory core 28 to execute the refresh operation when the refresh signal REF0Z is received. The core control circuit 26 outputs the refresh end signal RFPRE0Z to the refresh control circuit 22 in synchronization with a completion of the refresh operation.

The numerals "0" (zero) in the bank signal BNK0Z, the refresh signal REF0Z, the basic timing signal BRAS0Z and the refresh end signal RFPRE0Z are generated at the control circuits 22, 24, 26 of the bank BK0, or used only at the bank BK0. The control circuits 22, 24, 26 of the bank BK1 generate a refresh signal REF1Z, a basic timing signal BRAS1Z and a refresh end signal RFPRE1Z, or use these signals and the bank signal BNK1Z. Similarly, the control circuits 22, 24, 26 of the banks BK2-3 generate refresh signals REF2Z, REF3Z, basic timing signals BRAS2Z, BRAS3Z, and refresh end signals RFPRE2Z, RFPRE3Z, or use these signals and the bank signals BNK2Z, BNK3Z. Details of the memory core 28 are illustrated in FIG. 2.

Figure 2:
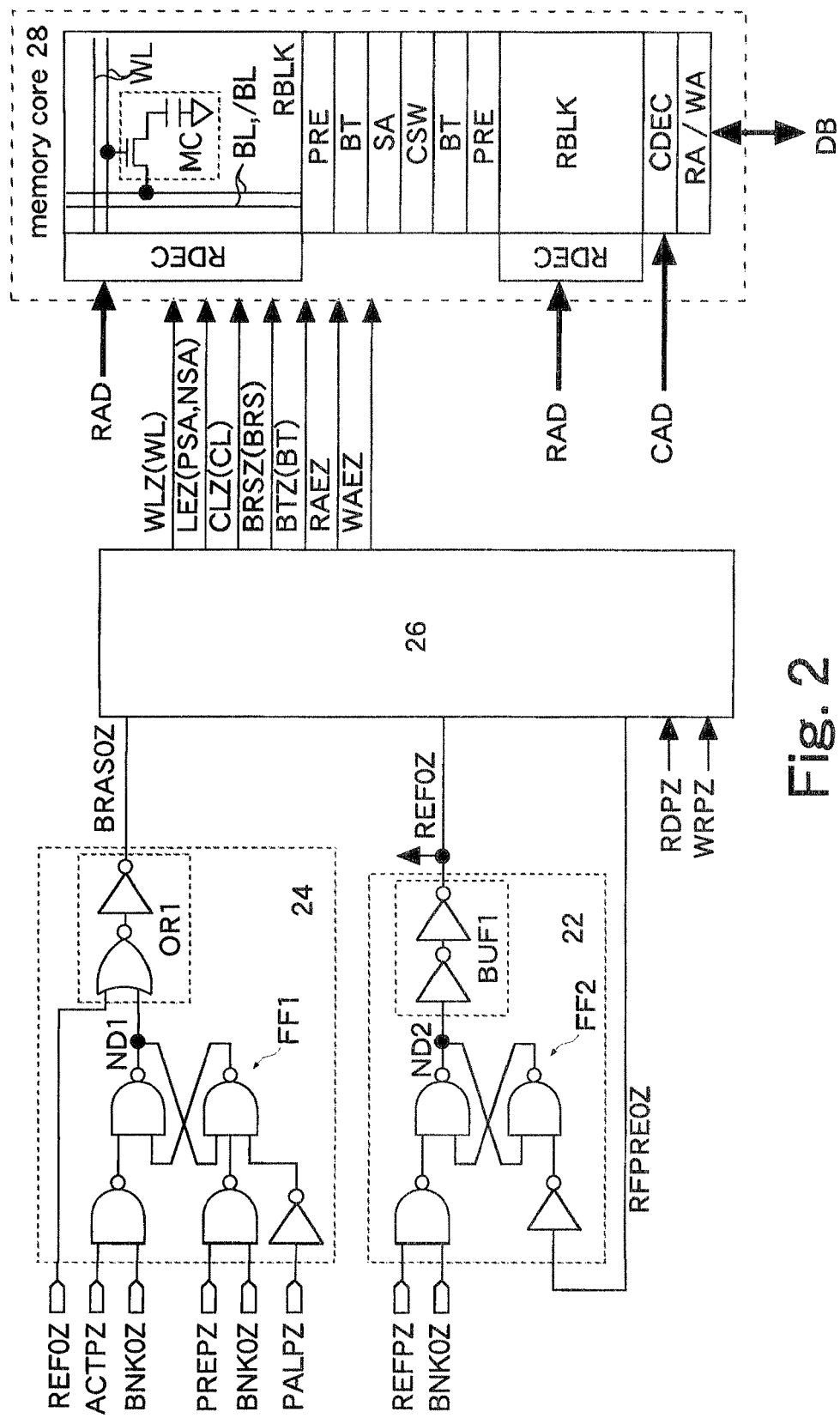
FIG. 2 illustrates details of a bank illustrated in FIG. 1.

FIG. 2 illustrates details of the bank BK0 illustrated in FIG. 1. The banks BK1-3 are the same as FIG. 2 except that the numerals in signal names are different. The bank control circuit 24 has a flip-flop FF1 set in synchronization with the activation command signal ACTPZ supplied together with the bank signal BNK0Z and reset in synchronization with the single precharge command signal PREPZ or the all-precharge command signal PALPZ supplied together with the bank signal BNK0Z, and an OR circuit OR1 coupled to an output node of the flip-flop FF1. The flip-flop FF1 changes an output node ND1 into high level by the set, and changes the output node ND1 into low level by the reset. The OR circuit OR1 activates the basic timing signal BRAS0Z into high level during the period when the flip-flop FF1 is set or the period when the refresh signal REF0Z is in high level. The basic timing signal BRAS0Z is an access signal to start the activation operation or the refresh operation of the memory core 28.

The refresh control circuit 22 has a flip-flop FF2 set in synchronization with the refresh command signal REFPZ supplied together with the bank signal BNK0Z and reset in synchronization with the refresh end signal RFPRE0Z, and a buffer circuit BUF1 coupled to an output node of the flip-flop FF2. The flip-flop FF2 changes an output node ND2 into high level by the set, and changes the output node ND2 into low level by the reset. The buffer circuit BUF1 outputs an output signal of the flip-flop FF2 as the refresh signal REF0Z.

Figure 7:
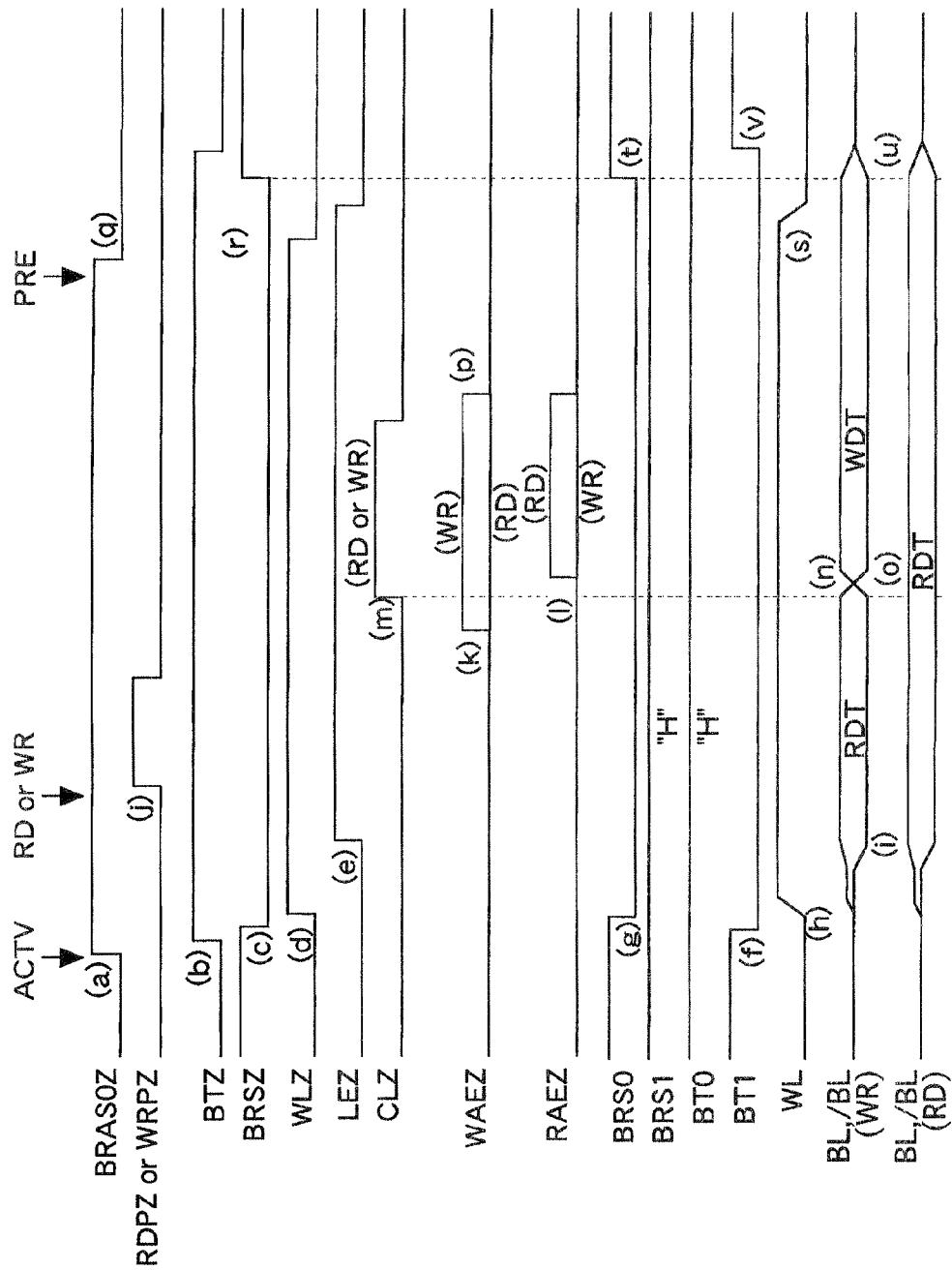
FIG. 7 illustrates an example of operations of a core control circuit and the memory core.
Figure 8:
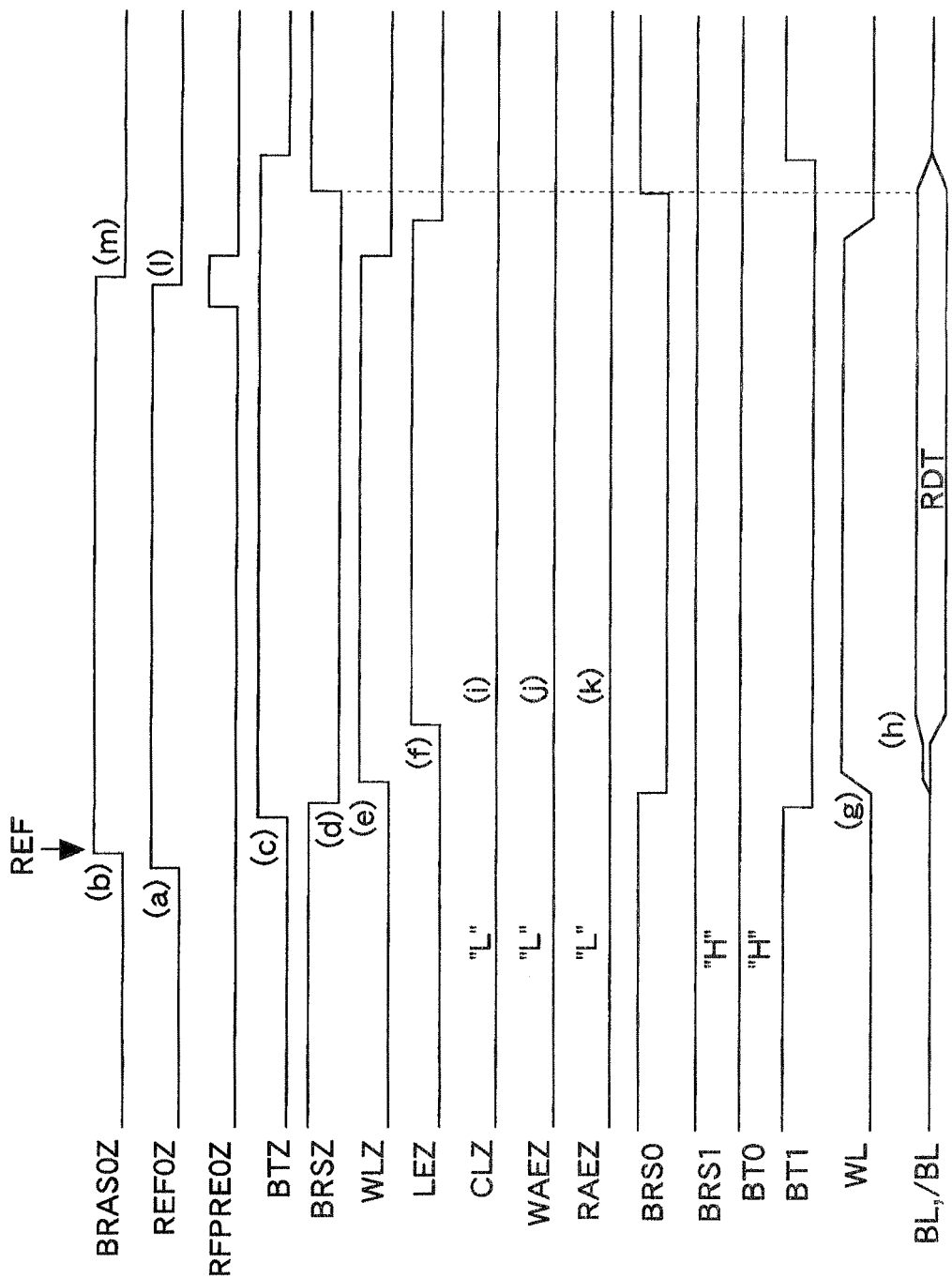
FIG. 8 illustrates another example of operations of the core control circuit and the memory core.
Figure 9:
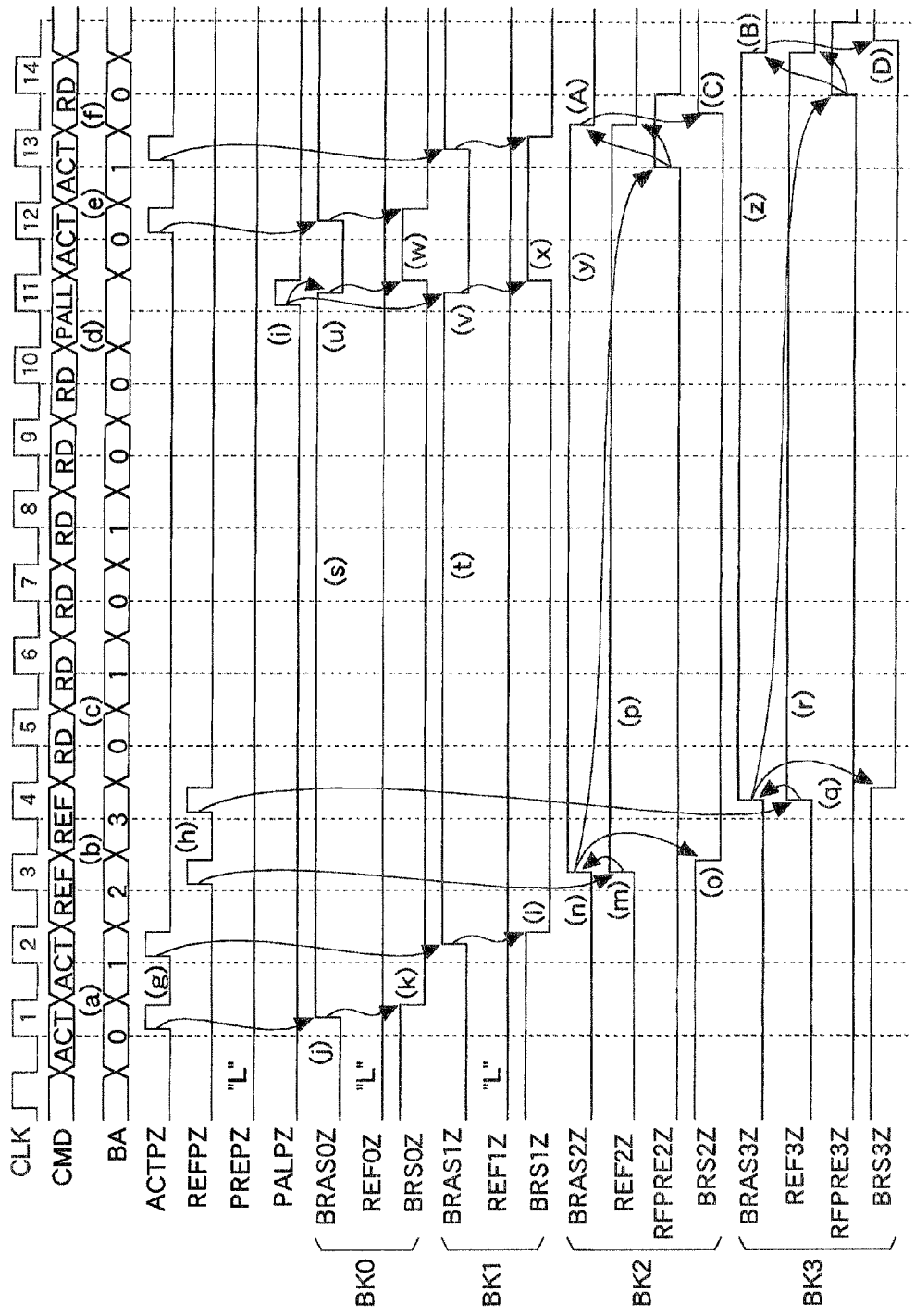
FIG. 9 illustrates an example of operations of the semiconductor memory illustrated in FIG. 1.

The core control circuit 26 outputs a word control signal WLZ, a sense amplifier control signal LEZ, a column control signal CLZ, a precharge control signal BRSZ, a bit control signal BTZ, a read amplifier enable signal RAEZ and a write amplifier enable signal WAEZ to the memory core 28 in synchronization with the activation of the basic timing signal BRAS0Z. Signals shown in parentheses together with the control signals WLZ, LEZ, BRSZ, BTZ output from the core control circuit 26 represent signals generated based on the control signals. Timings of the signals output from the core control circuit 26 are illustrated in FIG. 7 to FIG. 9.

Figure 3:
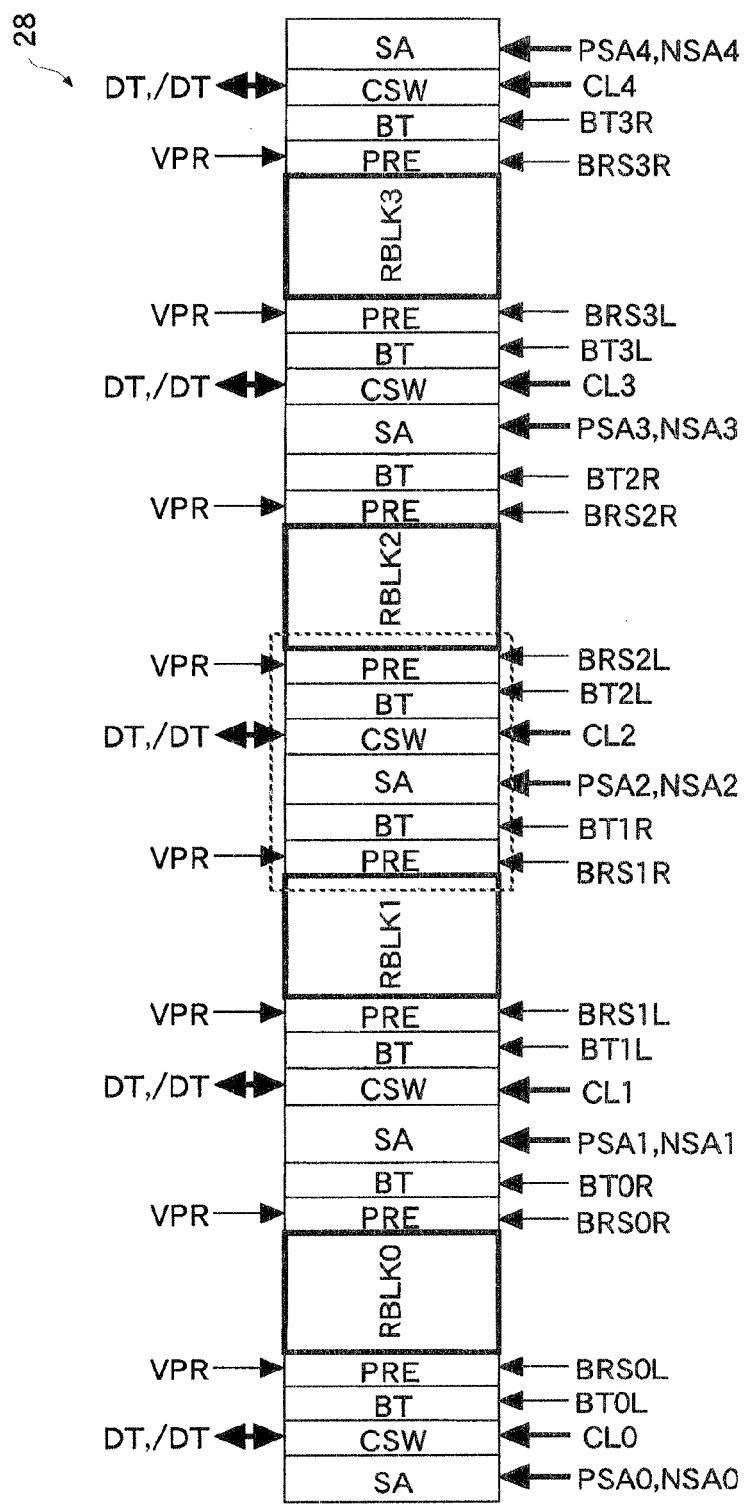
FIG. 3 illustrates a summary of a memory core illustrated in FIG. 1.

The memory core 28 has a row decoder RDEC, a column decoder CDEC, a precharge circuit PRE, a coupling switch BT, a sense amplifier SA, a column switch CSW, a read amplifier RA, a write amplifier WA and a plurality of memory blocks RBLK. Four pieces of memory blocks RBLK are formed, for example, as illustrated in FIG. 3. Each memory block RBLK has a plurality of dynamic memory cells MC, word lines WL coupled to the memory cells MC being in line in one direction, and bit lines BL, /BL coupled to the memory cells MC being in line in a direction perpendicular to the one direction. The memory cell MC has a capacitor to hold data as electric charge, and a transfer transistor to couple one end of the capacitor to the bit line BL (or /BL). The other end of the capacitor is coupled to a precharge voltage line VPR. Incidentally, the other end of the capacitor may be coupled to a cell plate voltage line VCP (not-shown) instead of the precharge voltage line VPR. A gate of the transfer transistor is coupled to the word line WL. Any of the activation operation, the read operation, the write operation, and the refresh operation is executed by a selection of the word line WL.

The row address decoder RDEC decodes the row address signal RAD to select any of the word lines WL. The column address decoder CDEC decodes the column address signal CAD to select the number of bit line pair BL, /BL corresponding to the number of bits of the data terminal DQ. The sense amplifier SA amplifies a difference of signal amount of a data signal read to the bit line pair BL, /BL. The column switch CSW couples the bit lines BL, /BL corresponding to the column address signal CAD to the read amplifier RA and the write amplifier WA. The read amplifier RA amplifies a complementary read data output via the column switch CSW and outputs to the data bus DB at the read operation time. The write amplifier WA amplifies a complementary write data supplied via the data bus DB and supplies to the bit line pair BL, /BL at the write operation time.

FIG. 3 illustrates a summary of the memory core 28 illustrated in FIG. 1. The precharge circuit PRE, the coupling switch BT, the column switch CSW and the sense amplifier SA are arranged, for example, at both sides of the respective memory blocks RBLK-3. Namely, the sense amplifier SA arranged between a pair of memory blocks RBLK (for example, RBLK0-1) adjacent with each other is shared by the pair of memory blocks RBLK (a shared sense amplifier system).

Each sense amplifier SA operates in synchronization with sense amplifier activation signals PSA, NSA (PSA0-4, NSA0-4). The sense amplifier activation signals PSA, NSA are signals synchronized with the sense amplifier control signal LEZ output from the core control circuit 26 illustrated in FIG. 1. Signal lines of the sense amplifier activation signals PSA, NSA are wired by each block of the sense amplifier SA. Each column switch CSW couples a complementary output of the sense amplifier SA to data lines DT, /DT in synchronization with a column switch signal CL (CL0-CL4). The column switch signal CL is a signal synchronized with the column control signal CLZ. A signal line of the column switch signal CL is wired by each group of the column switch CSW corresponding to the number of bits of the data terminal DQ. The data lines DT, /DT are coupled to the data buses DB, /DB via a not-shown switch circuit.

Each coupling switch BT operates in synchronization with a switch control signal BT (BT0L-BT3L, BT0R-BT3R). A signal line of the switch control signal BT is wired by each block of the coupling switch BT. The switch control signal BT is a signal synchronized with the bit control signal BTZ. Each precharge circuit PRE couples the bit lines BL, /BL to the precharge voltage line VPR in synchronization with the precharge control signal BRS (BRS0L-BRS3L, BRS0R-BRS3R). A signal line of the precharge control signal BRS is wired by each block of the precharge circuit PRE. The precharge control signal BRS is a signal synchronized with the precharge control signal BRSZ.

Figure 4:
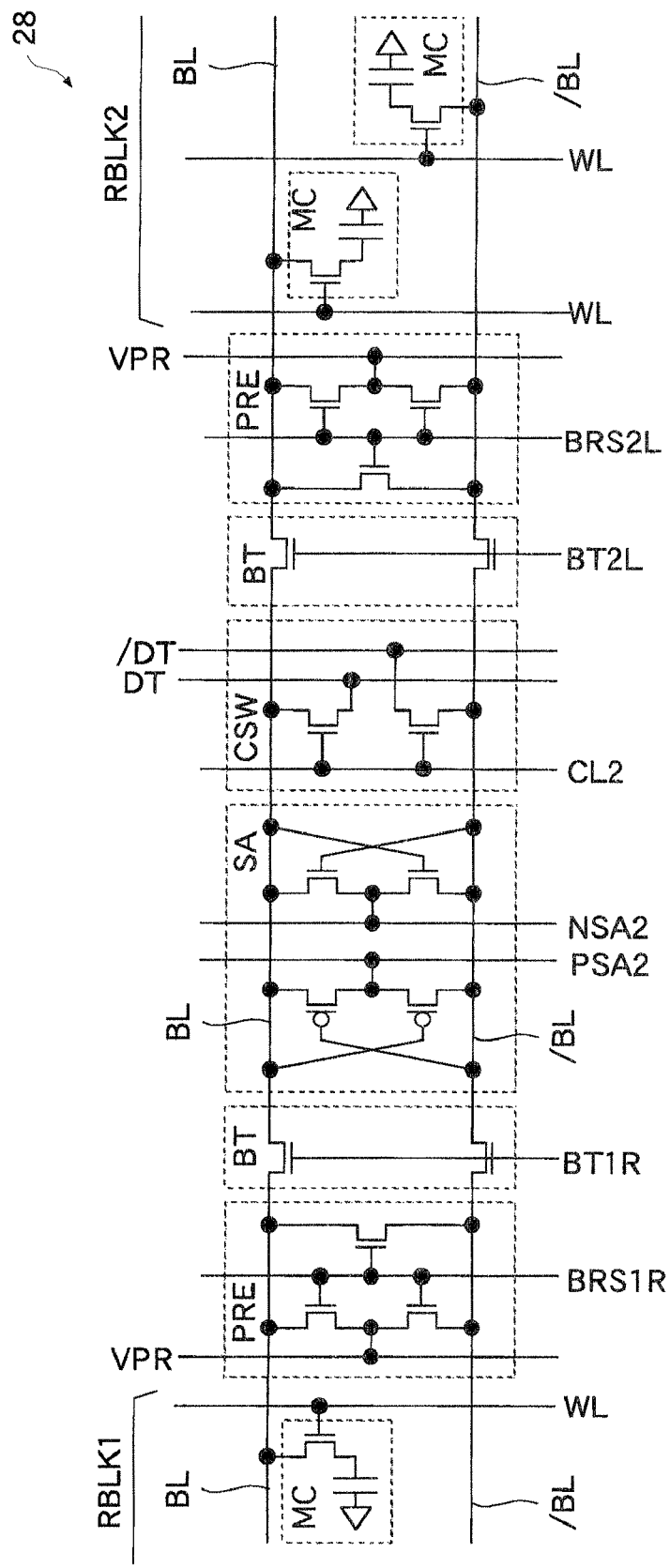
FIG. 4 illustrates details of an area shown by a dotted line frame in FIG. 3.

FIG. 4 illustrates details of an area shown by a dotted line frame in FIG. 3. Incidentally, the data lines coupled to the bit lines BL, /BL via the coupling switch BT are also called as the bit lines BL, /BL in FIG. 4 for convenience. The memory cell MC coupled to the word line WL is coupled to one of the bit lines BL, /BL. Accordingly, for example, the bit line /BL functions as a reference voltage line (a precharge voltage) when the memory cell MC coupled to the bit line BL is accessed.

The coupling switch BT is constituted of an nMOS transistor. One of a source/drain of the nMOS transistor is coupled to the bit line BL (or /BL), and the other of the source/drain of the nMOS transistor is coupled to the sense amplifier SA. A gate of the nMOS transistor receives the switch control signals BT (BT1R, BT2R). The coupling switch BT couples the bit lines BL, /BL of the memory block RBLK to the sense amplifier SA while the switch control signal BT in high logical level is received.

Each precharge circuit PRE is constituted of a pair of nMOS transistors to respectively couple the complementary bit lines BL, /BL to the precharge voltage line VPR, and an nMOS transistor to couple the bit lines BL, /BL with each other. A gate of the nMOS transistor of the precharge circuit PRE receives the precharge control signals BRS (BRS1R, BRS2L). The precharge circuit PRE supplies the precharge voltage VPR to the bit lines BL, /BL and equalizes a voltage of the bit lines BL, /BL while the precharge control signal BRS in high logical level is received.

The sense amplifier SA is constituted of a pair of CMOS inverters of which input and output are coupled with each other. The input of each CMOS inverter (a gate of a transistor) is coupled to the bit line BL (or /BL). Each CMOS inverter is constituted of an nMOS transistor and a pMOS transistor being in line in a lateral direction in the drawing. A source of the pMOS transistor of each CMOS inverter receives the sense amplifier activation signal PSA (PSA2). A source of the nMOS transistor of each CMOS inverter receives the sense amplifier activation signal NSA (NSA2). The sense amplifier activation signal PSA is set to a high level voltage when the sense amplifier SA operates, and set to the precharge voltage VPR when the sense amplifier SA does not operate. The sense amplifier activation signal NSA is set to a low level voltage (for example, a ground voltage) when the sense amplifier SA operates, and set to the precharge voltage VPR when the sense amplifier SA does not operate.

The column switch CSW is constituted of an nMOS transistor coupling the bit line BL to the data line DT and an nMOS transistor coupling the bit line /BL to the data line /DT. A gate of each nMOS transistor receives the column switch signal CL (CL2). The read data signal on the bit lines BL, /BL amplified by the sense amplifier SA at the read operation time is transmitted to the data lines DT, /DT via the column switch CSW. The write data signal supplied via the data lines DT, /DT at the write operation time is written to the memory cell MC via the bit lines BL, /BL. The data lines DT, /DT are coupled to the read amplifier RA and the write amplifier WA.

FIG. 5 illustrates a command specification of the memory MEM illustrated in FIG. 1. The memory MEM receives the activation command ACTV, the read command RD, the write command WR, the refresh command REF, the single precharge command PRE, the all-precharge command PALL and the mode register set command MRS via a command terminal CMD. The command decoder 14 illustrated in FIG. 1 recognizes a command in accordance with the command signals /CS, /RAS, /CAS, /WE, AP, and outputs the command signals ACTPZ, RDPZ, WRPZ, REFPZ, PREPZ, PALPZ, MRSPZ showing the recognized commands. The bank address signal BA is supplied to select the banks BK0-3. The address signal ADD is supplied to select the memory cell MC to be accessed. The character "V" in the drawing shows that a validating of a value is required, and the character "X" in the drawing shows that both low level and high level are available. The command specification illustrated in FIG. 5 is the same as a command specification of a general SDRAM. Namely, in this embodiment, the precharge operation of only the memory core 28 executing a specific operation (the activation operation) is executed in response to the all-precharge command PALL as illustrated in FIG. 9 while maintaining the conventional command specification. The precharge operation of the memory core 28 executing the operation other than the specific operation (the refresh operation) is disabled.

Figure 6:
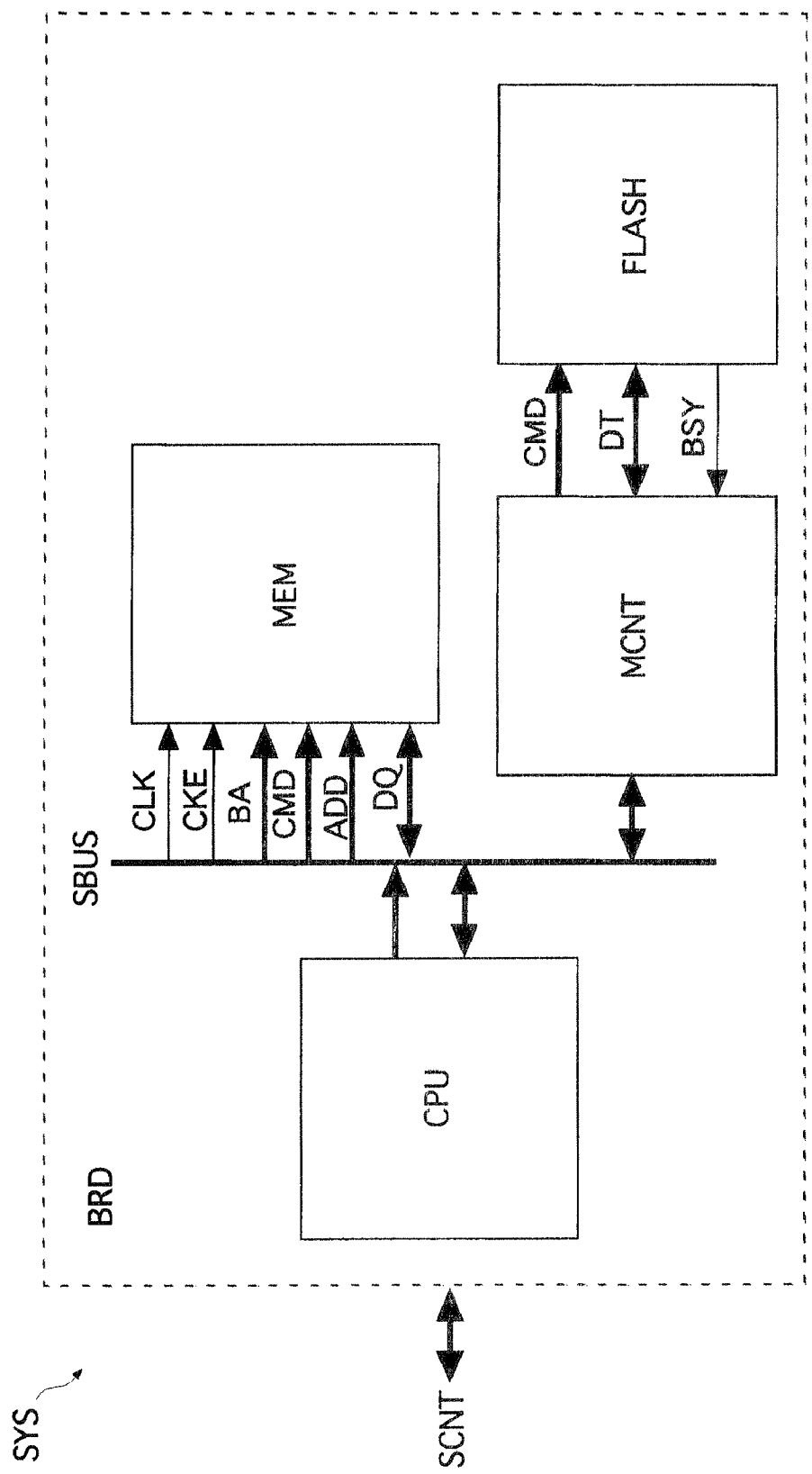
FIG. 6 illustrates an example of a system on which a semiconductor memory in FIG. 1 is mounted.

FIG. 6 illustrates an example of a system SYS on which the semiconductor memory MEM in FIG. 1 is mounted. The system SYS is, for example, a portable equipment such as a cellular phone. A circuit board BRD of the system SYS has the memory MEM illustrated in FIG. 1, a flash memory FLASH, a memory controller MCNT controlling accesses of the flash memory FLASH, and a CPU (a controller) accessing the memory MEM and the flash memory FLASH. Programs and nonvolatile various parameters to realize functions of the portable equipment are stored in the flash memory FLASH. For example, the memory MEM holds the program transferred from the flash memory FLASH at the power-on time, and holds work data and so on treated during the execution of the program. The program held in the memory MEM is executed by the CPU.

The CPU, the memory MEM and the memory controller MCNT are coupled with each other by a system bus SBUS. The circuit board BRD is coupled to a system controller SCNT via an external bus. The CPU outputs the clock signal CLK, the clock enable signal CKE, the command signal CMD, the address signals ADD, BA, and the data signal DQ (the write data signal) to access the memory MEM, and receives the data signal DQ (the read data signal) from the memory MEM. The circuit board BRD operates as a memory system.

In this embodiment, the memory MEM operates by the command specification of the general SDRAM as illustrated in FIG. 5. Accordingly, it is possible to mount the memory MEM illustrated in FIG. 1 on the system SYS without newly designing specifications of the circuit board BRD and the system SYS. In particular, it is not necessary to change the signal lines on the system SYS, and therefore, it is possible to mount the memory MEM illustrated in FIG. 1 on the system SYS without changing the circuit board BRD.

FIG. 7 illustrates an example of operations of the core control circuit 26 and the memory core 28 (the write operation or the read operation). In this example, the access request (the read command RD or the write command WR) is supplied after the activation command ACT is supplied, and the read operation or the write operation of the memory core 28 of the bank BK0 is executed. The operations of the other banks BK1-3 are executed as same as FIG. 7.

At first, the basic timing signal BRAS0Z is activated in response to the activation command ACT (FIG. 7(a)). The core control circuit 26 activates the bit control signal BTZ (FIG. 7 (b)), inactivates the precharge control signal BRSZ (FIG. 7 (c)), and activates the word control signal WLZ and the sense amplifier control signal LEZ (FIG. 7 (d, e)) in synchronization with the basic timing signal BRAS0Z. The switch control signal BT (BT1 in this example) corresponding to the bit line BL or /BL which does not execute the access operation is inactivated (FIG. 7 (f)) in synchronization with the bit control signal BTZ. The precharge control signal BRS (BRS0 in this example) is inactivated (FIG. 7 (g)) in synchronization with the precharge control signal BRSZ. The coupling between the bit lines BL, /BL and the precharge voltage line VPR is released by the inactivation of the precharge control signal BRS0.

The word line WL is activated in synchronization with the activation of the word control signal WLZ, and the data is read from the memory cell MC to the bit line BL (or /BL) (FIG. 7 (h)). The sense amplifier SA starts an amplifying operation in synchronization with the activation of the sense amplifier control signal LEZ, and amplifies a voltage difference of the bit line pair BL, /BL (a signal amount read from the memory cell MC to the bit line BL (or /BL)) (FIG. 7 (i)). As stated above, the core control circuit 26 executes the activation operation setting the memory core 28 into the activated state to execute the read operation or the write operation in response to the activation command ACT. In other words, the activation operation is the operation when the word line WL is activated, and the operation when the memory cell MC is coupled to the bit lines BL, /BL.

Next, the core control circuit 26 activates the read command signal RDPZ or the write command signal WRPZ in response to the read command RD or the write command WR (FIG. 7 (j)).

In the write operation, the write amplifier enable signal WAEZ to operate the write amplifier WA is activated in response to the write command WR (FIG. 7 (k)), and in the read operation, the read amplifier enable signal RAEZ to operate the read amplifier RA is activated in response to the read command RD (FIG. 7 (l)). Besides, the column control signal CLZ is activated in response to the write command WR and the read command RD, and the column switch CSW selected by the column address CAD is turned on (FIG. 7 (m)). In the write operation, write data WDT is supplied to the bit lines BL, /BL via the column switch CSW (FIG. 7 (n)). In the read operation, read data RDT on the bit lines BL, /BL is output to the data bus DB via the column switch CSW (FIG. 7 (o)). The column control signal CLZ and the write amplifier enable signal WAEZ or the read amplifier enable signal RAEZ are inactivated after a predetermined period (FIG. 7 (p)).

Next, in the write operation and the read operation, the basic timing signal BRAS0Z is inactivated in response to the precharge command PRE (FIG. 7 (q)). The core control circuit 26 sequentially inactivates the word control signal WLZ, the bit control signal BTZ, the precharge control signal BRSZ and the sense amplifier control signal LEZ in synchronization with the inactivation of the basic timing signal BRAS0Z (FIG. 7 (r)). The word line WL is inactivated in synchronization with the inactivation of the word control signal WLZ, and the coupling between a memory part of the memory cell MC and the bit line BL (or /BL) is released (FIG. 7 (s)). The precharge control signal BRS (BRS0 in this example) is activated in synchronization with the activation of the precharge control signal BRSZ (FIG. 7 (t)). The bit line BL or /BL executing the access operation is coupled to the precharge voltage line VPR by the activation of the precharge control signal BRS0 (FIG. 7 (u)). Namely, the precharge operation inactivating the memory core 28 in the activated state is executed. The switch control signal BT (BT1 in this example) corresponding to the bit line BL or /BL which does not execute the access operation is activated in synchronization with the inactivation of the bit control signal BTZ, and these bit lines BL, /BL are coupled to the sense amplifier SA (FIG. 7 (v)). The access operation (the write operation or the read operation) is then completed. The operations responding to the all-precharge command PALL are described in FIG. 9.

FIG. 8 illustrates another example of operations (the refresh operation) of the core control circuit 26 and the memory core 28. Detailed descriptions of the operations which are the same as those in FIG. 7 are not given. In the refresh operation, the refresh signal REF0Z is activated in response to the refresh command signal REF (FIG. 8 (a)). The basic timing signal BRAS0Z is activated in synchronization with the refresh signal REF0Z (FIG. 8 (b)). Accordingly, the bit control signal BTZ, the precharge control signal BRSZ, the word control signal WLZ and the sense amplifier control signal LEZ are activated in response to the refresh command REF (FIG. 8 (c, d, e, f)). Consequently, the activation of the word line WL and the operation of the sense amplifier SA are started in response to the refresh command REF (FIG. 8 (g, h)). In the refresh operation, the column control signal CLZ, the write amplifier enable signal WAEZ and the read amplifier enable signal RAEZ are not activated (FIG. 8 (i, j, k)). After that, the refresh signal REF0Z is inactivated after a predetermined period (FIG. 8 (l)). The basic timing signal BRAS0Z is inactivated in response to the inactivation of the refresh signal REF0Z (FIG. 8 (m)), the precharge operation is executed as same as the above, and the refresh operation is completed.

FIG. 9 illustrates an example of operations of the semiconductor memory MEM illustrated in FIG. 1. In this example, the activation command ACT of the banks BK0-1 is supplied (FIG. 9 (a)), the refresh command REF of the banks BK2-3 is supplied (FIG. 9 (b)), and the read commands RD of the banks BK0-1 are sequentially supplied (FIG. 9 (c)). After the read operations of the banks BK0-1 are completed, the all-precharge command PALL is supplied to the memory MEM (FIG. 9 (d)). After that, the activation commands ACT of the banks BK0-1 are supplied (FIG. 9 (e)), and the read command RD of the bank BK0 is supplied (Fig. (f)). The command decoder 14 outputs the activation command signal ACTPZ in response to the activation command ACT (FIG. 9 (g)), outputs the refresh command signal REFPZ in response to the refresh command REF (FIG. 9 (h)), and outputs the all-precharge command signal PALPZ in response to the all-precharge command PALL (FIG. 9 (i)).

The bank control circuit 24 of the bank BK0 activates the basic timing signal BRAS0Z (an access signal) in synchronization with the activation command signal ACTPZ (FIG. 9 (l)). The core control circuit 26 of the bank BK0 inactivates a precharge control signal BRS0Z in synchronization with the basic timing signal BRAS0Z (FIG. 9 (k)). Any of the word lines WL of the bank BK0 is activated, and the bank BK0 is set into the activated state. Similarly, the basic timing signal BRAS1Z is activated and a precharge control signal BRS1Z is inactivated in synchronization with the activation command signal ACTPZ of the bank BK1 (FIG. 9 (l)). Any of the work lines WL of the bank BK1 is activated, and the bank BK1 is set into the activated state. An NAND gate receiving the activation command signal ACTPZ, an NAND gate of which output is coupled to the node ND1, and the OR circuit OR1 of the bank control circuit 24 of the banks BK0-1 operate as an activation circuit activating the basic timing signals BRAS0Z, BRAS1Z in response to the activation command signal ACTPZ to start the activation operation of the memory core 28.

The refresh control circuit 22 of the bank BK2 activates a refresh control signal REF2Z in synchronization with the refresh command signal REFPZ (FIG. 9 (m)). The bank control circuit 24 of the bank BK2 activates the basic timing signal BRAS2Z in synchronization with the refresh control signal REF2Z (FIG. 9 (n)). The core control circuit 26 of the bank BK2 inactivates a precharge control signal BRS2Z in synchronization with the basic timing signal BRAS2Z (FIG. 9 (o)). Further, the core control circuit 26 activates any of the word lines WL of the bank BK2 in synchronization with the refresh control signal REF2Z, and starts the refresh operation of the bank BK2 (FIG. 9 (p)). Similarly, the refresh control signal REF3Z and the basic timing signal BRAS3Z are activated and a precharge control signal BRS3Z is inactivated in synchronization with the refresh command signal REFPZ of the bank BK3 (FIG. 9 (q)). Any of the word lines WL of the bank BK3 is activated, and the refresh operation of the bank BK3 is started (FIG. 9 (r)). The OR circuit OR1 of the bank control circuit 24 of the banks BK2-3 operates as an activation circuit activating the basic timing signals BRAS2Z, BRAS3Z in response to the refresh command signal REFPZ to start the activation operation of the memory core 28.

After this, the bank control circuit 24 and the core control circuit 26 of the banks BK0-1 execute the read operation of the memory core 28 every time when the read command signals RDPZ are received (FIG. 9 (s, t)). The bank control circuit 24 of the banks BK0-1 resets the flip-flop FF1 in synchronization with the all-precharge command signal PALPZ, and inactivates the basic timing signals BRAS0Z, BRAS1Z output from the OR circuit OR1 (FIG. 9 (u, v)). The core control circuit 26 of the banks BK0-1 activates the precharge control signals BRS0Z, BRS1Z in synchronization with the basic timing signals BRAS0Z, BRAS1Z, and starts the precharge operation (FIG. 9 (*w, x*)). An inverter and a three-input NAND gate receiving the all-precharge command signal PALPZ operate as an inactivation circuit inactivating the basic timing signals BRAS0Z, BRAS1Z in response to the all-precharge command signal PALPZ to terminate the activation operation, in the bank control circuit 24 of the banks BK0-1 executing the activation operation.

On the other hand, the bank control circuit 24 of the banks BK2-3 resets the flip-flop FF1 in synchronization with the all-precharge command signal PALPZ. However, the OR circuit OR1 maintains the activated states of the basic timing signals BRAS2Z, BRAS3Z because the refresh control signals REF2Z, REF3Z are activated (FIG. 9 (*y, z*)). The OR circuit OR1 of the bank control circuit 24 of the banks BK2-3 executing the refresh operation operates as an inactivation disable circuit disabling the inactivation of the precharge control signals BRS2Z, BRS3Z responding to the all-precharge command PALL to terminate the refresh operation. As stated above, in this embodiment, the precharge operation is executed only at the banks BK0-1 requiring the precharge operation in response to the all-precharge command PALL. The bank control circuit 24 automatically judges whether the precharge operation is to be executed or not in accordance with the operation state of the memory core 28. In other words, the memory MEM can determine the bank BK to be precharged without receiving information such as an address signal showing the bank BK to be precharged from outside of the memory MEM. Accordingly, the command specification can be the same as the conventional one. Further, it is possible to prevent that the number of input times of the precharge command to the memory MEM increases because it is not necessary to receive the command showing the bank BK to be precharged.

The refresh control circuit 22 of the banks BK2-3 inactivates the refresh signals REF2Z, REF3Z, and the basic timing signals BRAS2Z, BRAS3Z in response to the refresh end signals RFPRE2Z, RFPRE3Z from the core control circuit 26 (FIG. 9 (A, B)). The precharge control signals BRS2Z, BRS3Z are inactivated, and the precharge operation accompanied by the refresh operation is executed independent from the all-precharge command PALL (FIG. 9 (C, D)).

Figure 10:
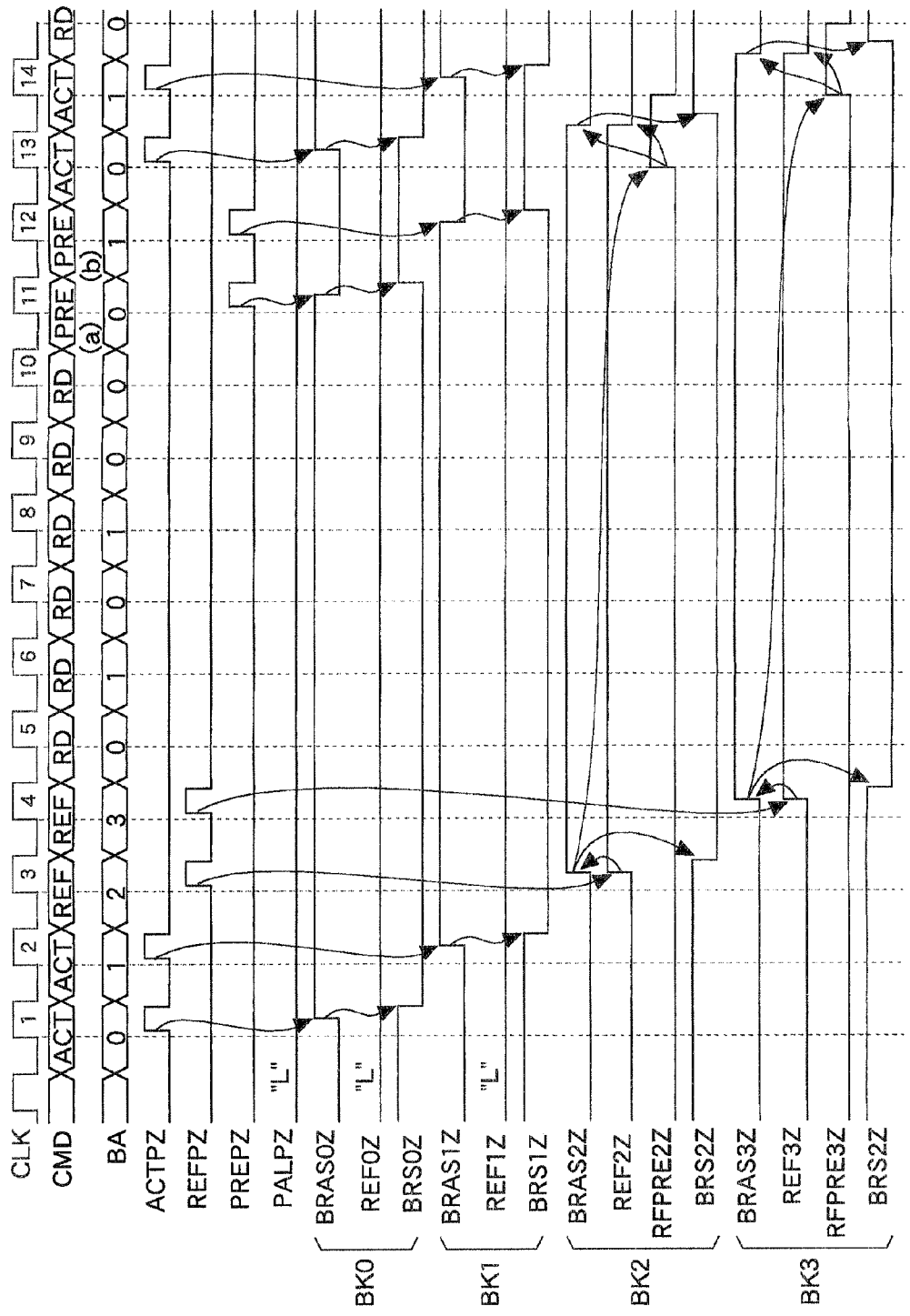
FIG. 10 illustrates an example of operations of a semiconductor memory before the semiconductor memory in FIG. 1 is proposed.

FIG. 10 illustrates an example of operations of a semiconductor memory before the semiconductor memory MEM in FIG. 1 is proposed. The operations until the 10th clock cycles are the same as those in FIG. 9. In the semiconductor memory of this example, the precharge operations of all banks BK0-3 are executed by the supply of the all-precharge command PALL. Accordingly, it is necessary to precharge the banks one by one, by the precharge command PRE when the refresh operation is being executed at any of the banks BK0-3 (FIG. 10 (*a, b*)). Accordingly, the number of supplying times of the precharge command PRE increases, and access efficiency of the memory MEM decreases.

As stated above, in this embodiment, it is possible to execute the precharge operation of only the memory core 28 which requires the termination of the activation operation, and to terminate the operation without specifying the memory core 28 from outside of the semiconductor memory MEM. It is possible to determine the memory core 28 requiring the termination of the operation while maintaining the compatibility of a command input specification because the information specifying the memory core 28 of which operation is to be terminated is not necessary. The access efficiency improves because unnecessary supply of the precharge command PRE can be prevented. Namely, it is possible to improve performance of the system SYS.

Figure 11:
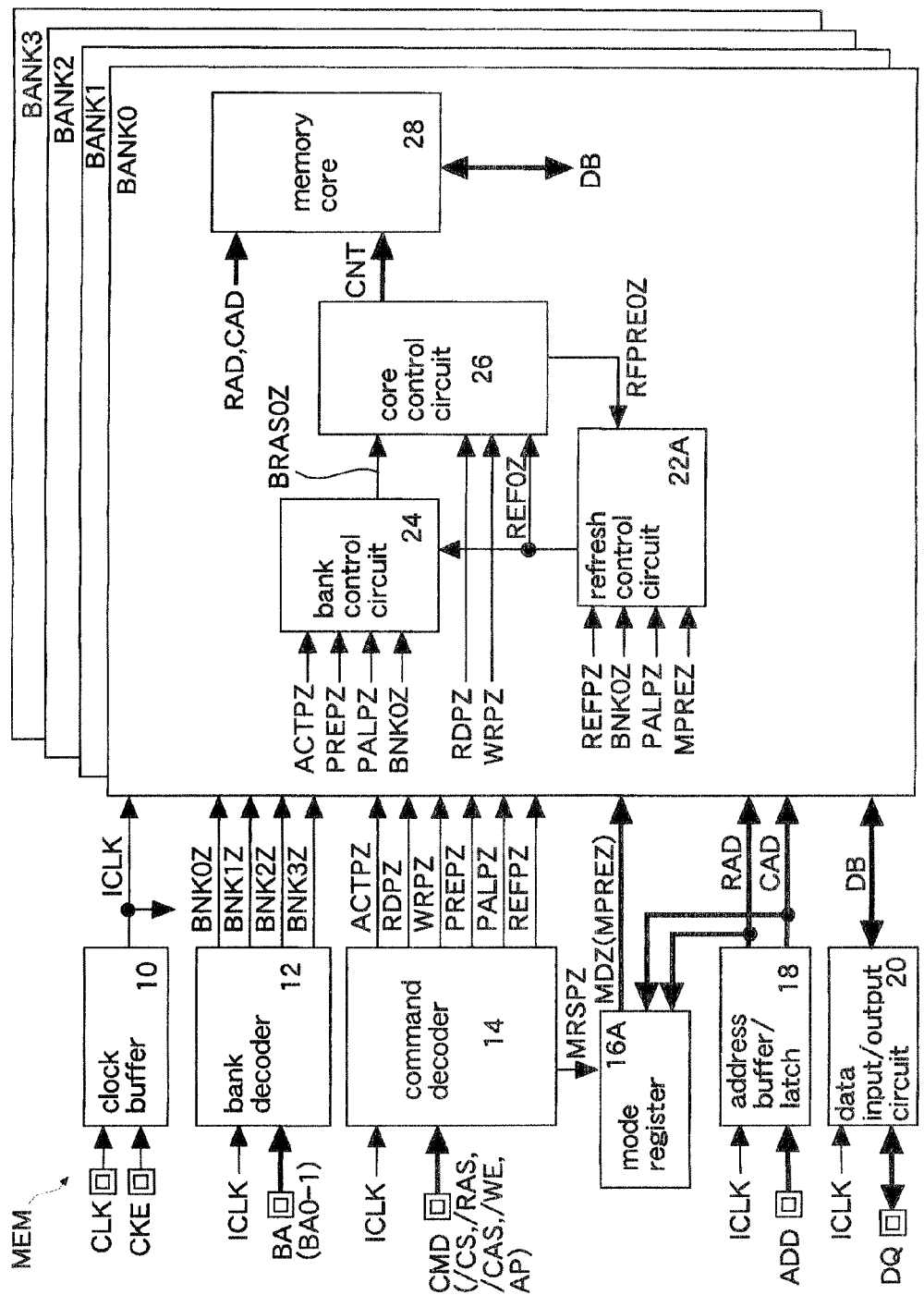
FIG. 11 illustrates another embodiment.

FIG. 11 illustrates another embodiment. The same reference numerals and symbols are used for the same elements as the elements described in the above-stated embodiment, and a detailed description thereof is not given. In this embodiment, a mode register 16A and a refresh control circuit 22A are different from FIG. 1. The other constitution is the same as that of the above-stated embodiment. The semiconductor memory MEM is, for example, mounted on the system SYS as illustrated in FIG. 6.

The mode register 16A has functions to receive the row address signal RAD or the column address signal CAD as mask information, set the received mask information in a housing register, and output a mask signal MPREZ in accordance with a set value of the register, in synchronization with the mode register set signal MRSPZ, in addition to the functions of the mode register 16 in FIG. 1. The refresh control circuit 22A has a function to judge whether the all-precharge command signal PALPZ is to be received or not in accordance with the mask signal MPREZ, in addition to the functions of the refresh control circuit 22 in FIG. 1.

Figure 12:
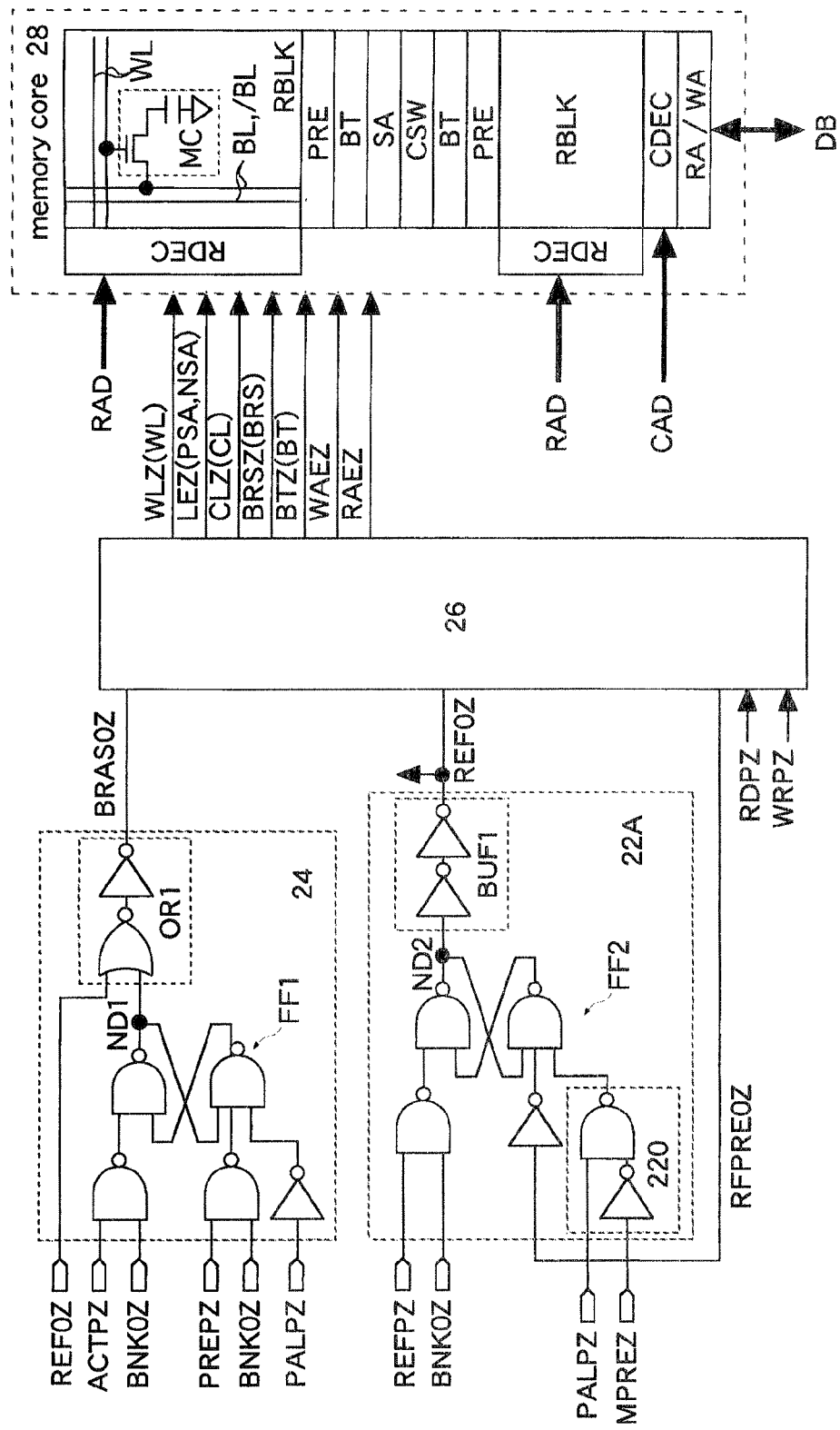
FIG. 12 illustrates details of a bank illustrated in FIG. 11.

FIG. 12 illustrates details of the bank BK0 illustrated in FIG. 11. The banks BK1-3 are the same as FIG. 12 except that the numerals in signal names are different. FIG. 12 is the same as FIG. 2 except that the refresh control circuit 22A is different.

The refresh control circuit 22A is constituted by adding a disable invalidating circuit 220 to the refresh control circuit 22 in FIG. 2. The disable invalidating circuit 220 has an inverter inverting a logic of the mask signal MPREZ, and an NAND gate receiving an output signal of the inverter and the all-precharge command signal PALPZ. An output of the disable invalidating circuit 220 is coupled to an NAND gate receiving the refresh end signal RFPRE0Z of the flip-flop FF2. The disable invalidating circuit 220 outputs a low level to a reset input of the flip-flop FF2 in response to the activation of the all-precharge command signal PALPZ, when the mask signal MPREZ is in low level. The disable invalidating circuit 220 outputs a high level to the reset input of the flip-flop FF2 regardless of the level of the all-precharge command signal PALPZ, when the mask signal MPREZ is in high level.

In this embodiment, the flip-flop FF2 is reset in synchronization with the activation of the all-precharge command signal PALPZ when a mask bit of the mode register 16A is set to the low level, and the low level mask signal MPREZ is output. The refresh signal REF0Z is inactivated by the reset of the flip-flop FF2. Accordingly, the OR circuit OR1 of the bank control circuit 24 of the bank BK (for example, BK0) executing the refresh operation inactivates the basic timing signal BRAS0Z in synchronization with the all-precharge command signal PALPZ. Namely, the precharge operations of all banks BK0-3 are executed and the operations are terminated by the all-precharge command PALL, regardless of the operation state of the memory core 28. This operation is the same as the operation of the all-precharge command PALL of the general SDRAM. As stated above, the disable invalidating circuit 220 invalidates the operation of an inactivation disabling of the basic timing signal BRAS0Z by the OR circuit OR1 to terminate the refresh operation in response to the all-precharge command PALL when the mask signal MPREZ is received.

Figure 13:
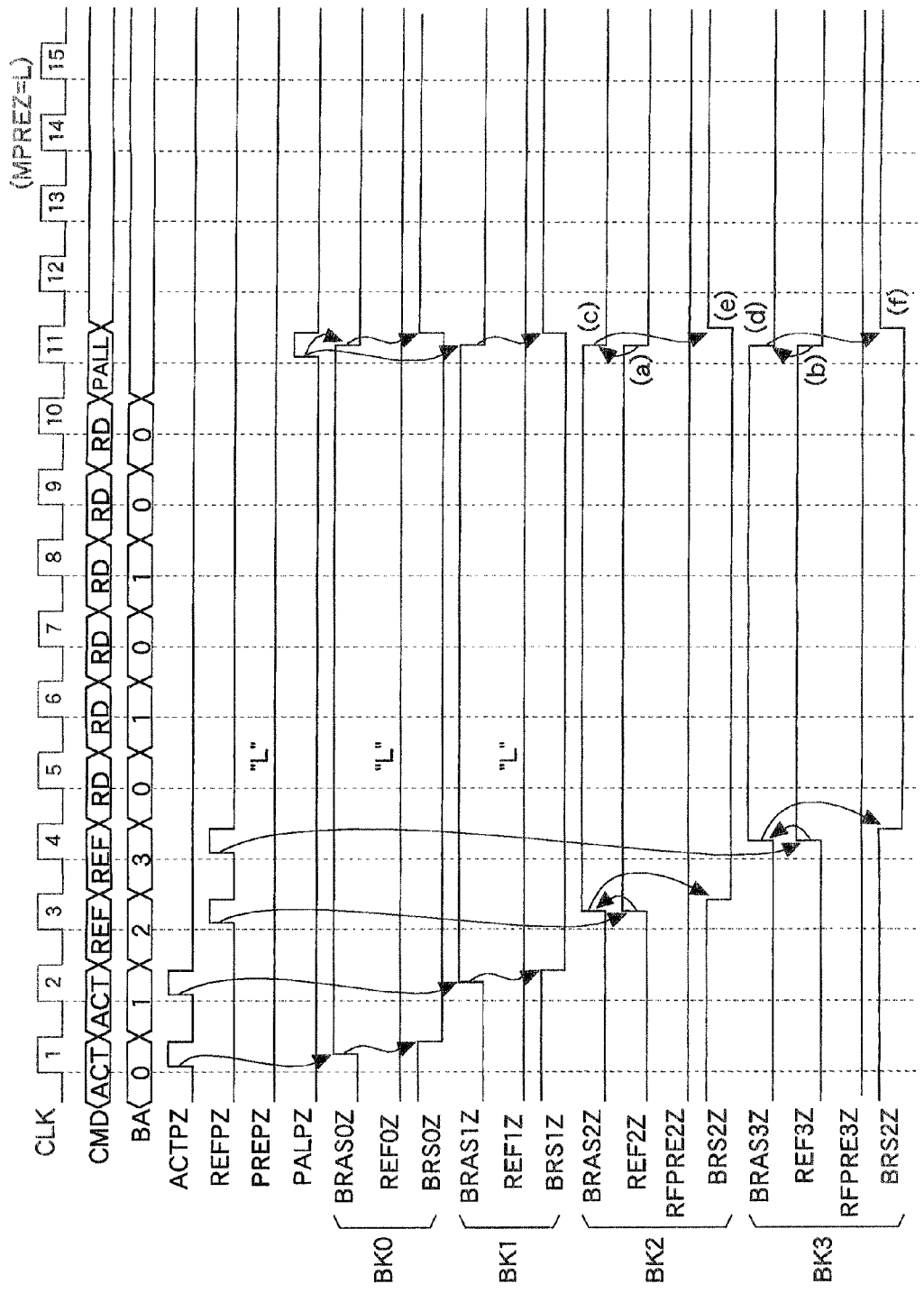
FIG. 13 illustrates an example of operations of a semiconductor memory illustrated in FIG. 11.

FIG. 13 illustrates an example of operations of the semiconductor memory MEM illustrated in FIG. 11. The drawing shows the operation when the mask signal MPREZ is in low level L. The operation when the mask signal MPREZ is in high level is the same as FIG. 9. The operations until the 10th clock cycles are the same as those in FIG. 9. The all-precharge command PALL is supplied to the memory MEM in synchronization with the 11th clock cycle. At this time, the banks BK0-1 execute the activation operation or the read operation, and the banks BK2-3 execute the refresh operation. The precharge operations of the banks BK0-1 are the same as those in FIG. 9.

In the banks BK2-3, the flip-flop FF2 is reset and the refresh signals REF2Z, REF3Z are inactivated in synchronization with the all-precharge command signal PALPZ (FIG. 13 (a, b)). The bank control circuit 24 inactivates the basic timing signals BRAS2Z, BRAS3Z in synchronization with the inactivation of the refresh signals REF2Z, REF3Z (FIG. 13 (c, d)). The core control circuit 26 activates the precharge control signals BRS2Z, BRS3Z in synchronization with the inactivation of the basic timing signals BRAS2Z, BRAS3Z (FIG. 13 (e, f)). As a result, the refresh operation is interrupted in response to the all-precharge command PALL, and the precharge operation is started.

Incidentally, there is a possibility that the data held in the memory cell MC is lost if the refresh operation is interrupted. Accordingly, the all-precharge command PALL is supplied after the refresh operation of the bank BK3 is completed, for example, in synchronization with the 15th clock cycle in the actual operation.

As stated above, it is possible to obtain the similar effect to the above-stated embodiment also in this embodiment. Further, it is possible to precharge the memory core 28 executing the refresh operation in accordance with the mask signal MPREZ, in response to the precharge command PALL. As a result, it is possible to operate the memory MEM by using the command specification which is the same as the conventional SDRAM without providing a special external terminal.

Figure 14:
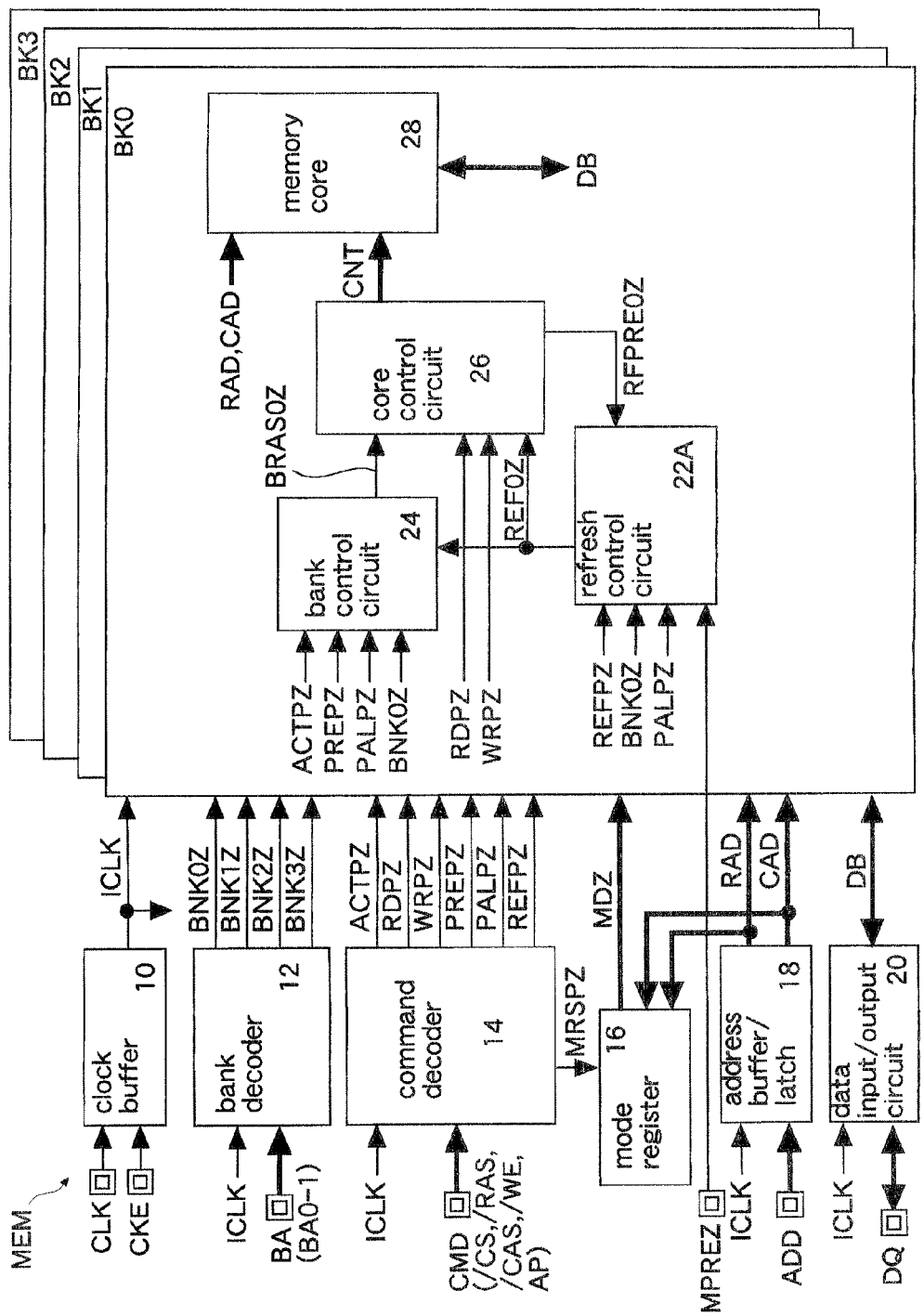
FIG. 14 illustrates still another embodiment.

FIG. 14 illustrates still another embodiment. The same reference numerals and symbols are used for the same elements as the elements described in the above-stated embodiment, and the detailed description thereof is not given. The semiconductor memory MEM of this embodiment has an external terminal to receive the mask signal MPREZ. The other constitution is the same as that of FIG. 11 except that the mode register 16 is different. The semiconductor memory MEM is, for example, mounted on the system SYS as illustrated in FIG. 6.

In this embodiment, the memory MEM directly receives the mask signal MPREZ from outside of the memory MEM, and executes the same operations as the above-stated FIG. 13. As a result, it is possible to operate the memory MEM by using the command specification which is the same as the conventional SDRAM in accordance with the mask signal MPREZ.

Figure 15:
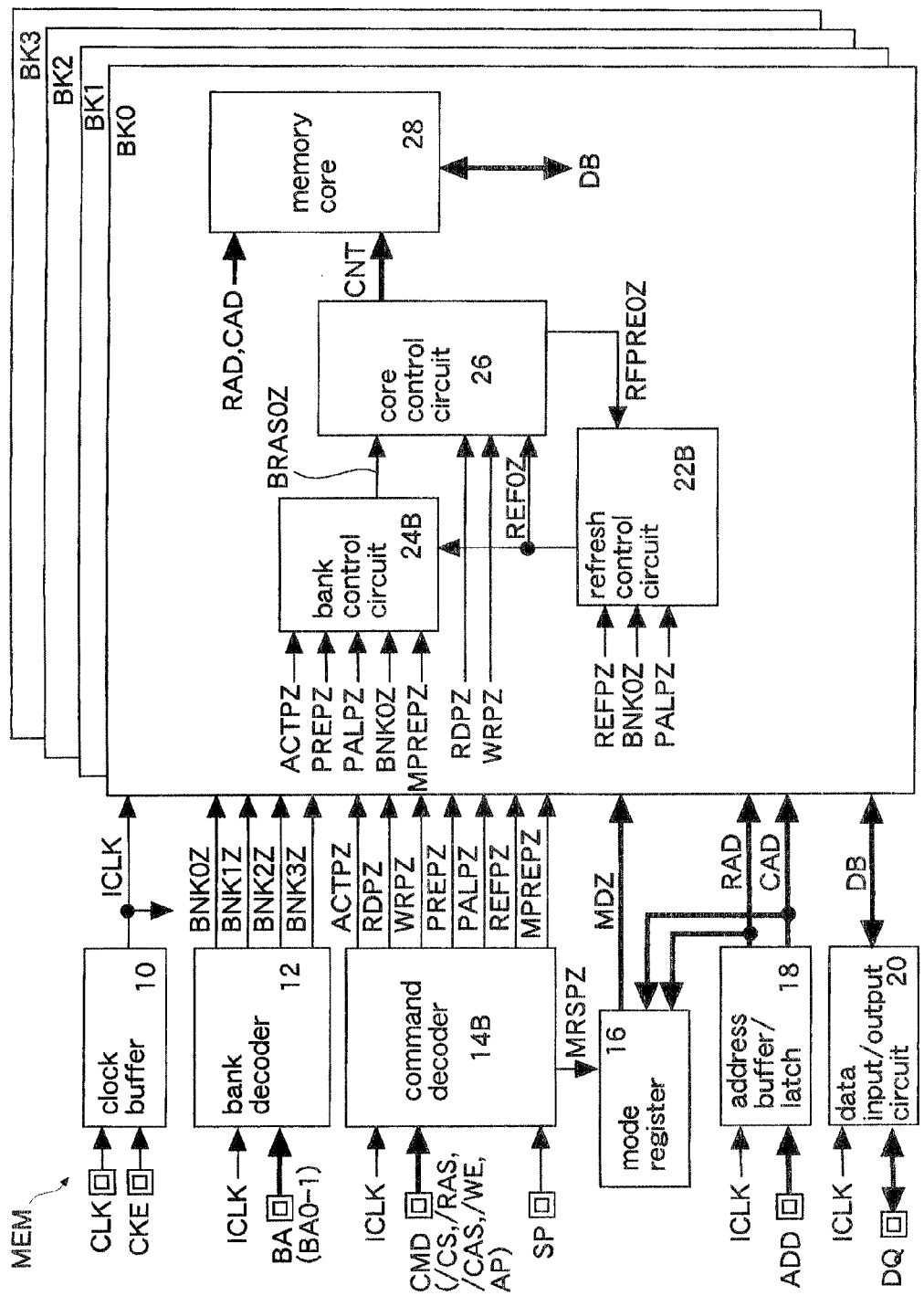
FIG. 15 illustrates still another embodiment.

FIG. 15 illustrates still another embodiment. The same reference numerals and symbols are used for the same elements as the elements described in the above-stated embodiment, and the detailed description thereof is not given. In this embodiment, a command decoder 14B, a refresh control circuit 22B and a bank control circuit 24B are different from FIG. 1. The other constitution is the same as that of the above-stated embodiments.

The command decoder 14B receives a special command signal SP for the precharge command together with the command signal CMD. The command decoder 14B activates the precharge command signal PREPZ when the precharge command PRE is received together with the command signal SP in low level. The command decoder 14B activates a precharge command signal MPREPZ when the precharge command signal PREPZ is received together with the command signal SP in high level. Namely, the command decoder 14B has a selector outputting the precharge command PRE as the precharge command signal PREPZ or MPREPZ in accordance with the command signal SP. Functions of the command decoder 14B (a command specification of the memory MEM) are illustrated in FIG. 17. Details of the refresh control circuit 22B and the bank control circuit 24B are illustrated in FIG. 16.

Figure 16:
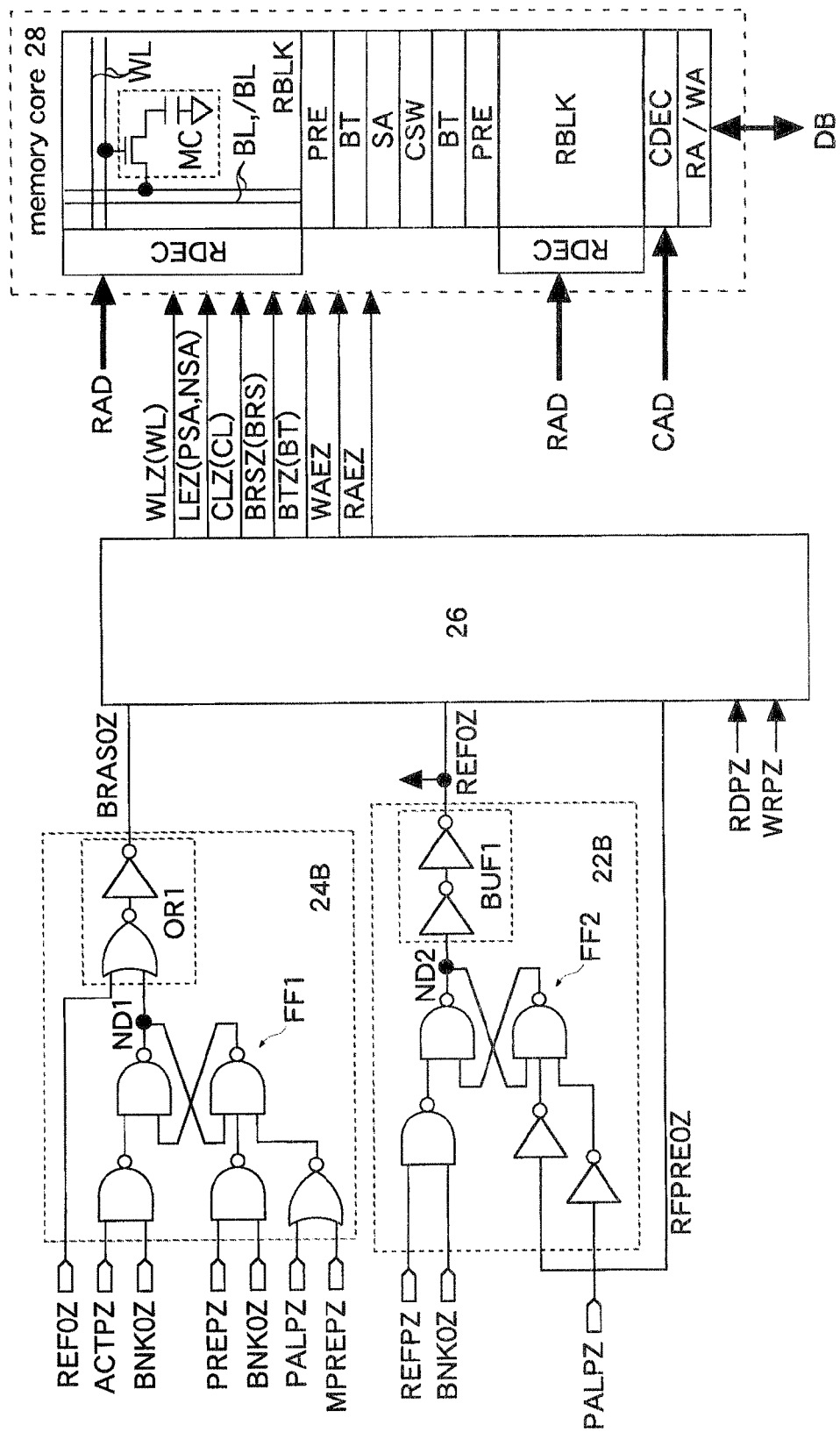
FIG. 16 illustrates details of a bank illustrated in FIG. 15.

FIG. 16 illustrates details of the bank BK0 illustrated in FIG. 15. The banks BK1-3 are the same as FIG. 16 except that the numerals in signal names are different. In the refresh control circuit 22B, an NAND gate receiving the refresh end signal RFPRE0Z of the flip-flop FF2 receives an inversion signal of the all-precharge command signal PALPZ via an inverter. The other constitution of the refresh control circuit 22B is the same as the refresh control circuit 22 in FIG. 2. The refresh control circuit 22B inactivates the refresh signal REF0Z in synchronization with the all-precharge command signal PALPZ. In the refresh control circuit 22B, the inverter receiving the all-precharge command signal PALPZ and the flip-flop FF2 reset in synchronization with the all-precharge command signal PALPZ operate as a disable invalidating circuit invalidating the operation of an inactivation disabling of the basic timing signal BRAS0Z by the OR circuit OR1.

The bank control circuit 24B is constituted of replacing the inverter coupled to the three-input NAND of the bank control circuit 24 in FIG. 2 with an NOR gate. The NOR gate receives the all-precharge command signal PALPZ and the precharge command signal MPREPZ. The bank BK executing the refresh operation is precharged by the all-precharge command PALL, but not precharged by the precharge command signal MPREPZ, by the refresh control circuit 22B and the bank control circuit 24B. The bank BK executing the activation operation is precharged by the all-precharge command PALL or the precharge command signal MPREPZ.

FIG. 17 illustrates a command specification of the semiconductor memory MEM illustrated in FIG. 15. Difference from FIG. 5 is that the precharge command PRE is recognized as the different precharge commands PREPZ, MPREPZ in accordance with the levels of the command signal SP. The command specification when the command signal SP is in low level is the same as the general SDRAM. For example, the external terminal to which the command signal is supplied is coupled to a ground line and so on in the memory MEM or on the circuit board BRD, and thereby, it is possible to operate the memory MEM as the general SDRAM.

The precharge command MPREPZ is a first termination command executing the precharge operation of the bank BK executing the activation operation, and disabling the precharge operation of the bank BK executing the refresh operation. The precharge command PREPZ executes the precharge operation of any of the banks BK0-3 shown by the bank address signal BA when the refresh operation is not executed (a single precharge operation). The all-precharge command PALPZ is a second termination command executing the precharge operation of the bank BK executing the activation operation and the refresh operation.

As stated above, it is possible to obtain the similar effect to the above-stated embodiments also in this embodiment. Further, a command terminal SP is added, and thereby, it becomes possible to identify the precharge command MPREPZ disabling the precharge operation of the bank BK in which the refresh operation is executed and the precharge command PALPZ enabling the precharge operation of the bank BK in which the refresh operation is executed by the command decoder 14 (the command input circuit).

FIG. 18 illustrates a command specification of the semiconductor memory MEM in still another embodiment. In this embodiment, the command decoder activates the precharge command signal MPREPZ in response to the all-precharge command PALL when the command signal SP is in high level. The command specification when the command signal SP is in low level is the same as the general SDRAM. The circuits excluding the command decoder are the same as FIG. 15. As stated above, it is possible to obtain the similar effect to the above-stated embodiments also in this embodiment.

FIG. 19 illustrates a command specification of the semiconductor memory MEM in still another embodiment. In this embodiment, the command decoder activates the precharge command signal MPREPZ in response to the precharge command PRE and the all-precharge command PALL when the command signal SP is in high level. The command specification when the command signal SP is in low level is the same as the general SDRAM. The circuits excluding the command decoder are the same as FIG. 15. As stated above, it is possible to obtain the similar effect to the above-stated embodiments also in this embodiment.

Figure 20:
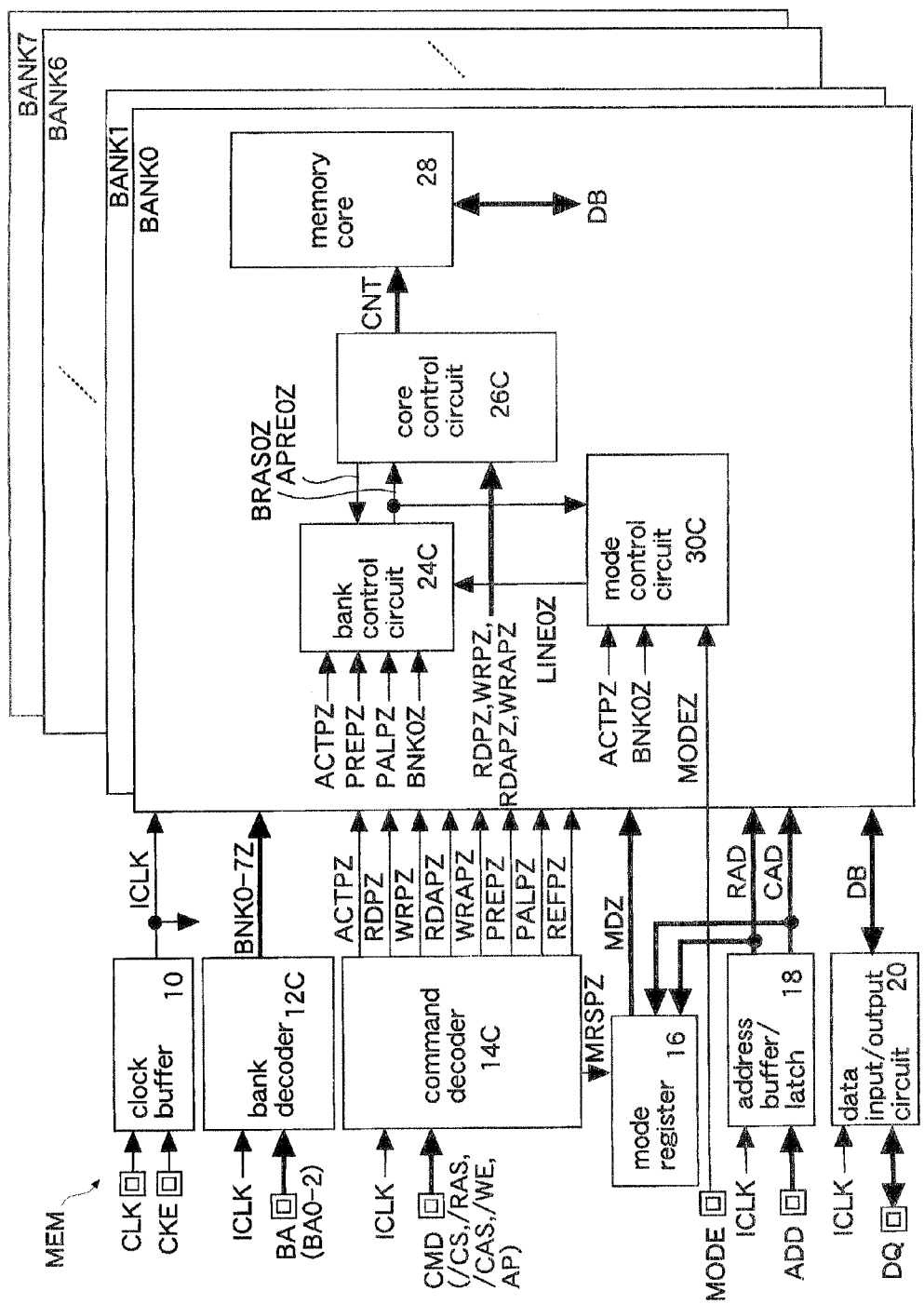
FIG. 20 illustrates still another embodiment.

FIG. 20 illustrates still another embodiment. The same reference numerals and symbols are used for the same elements as the elements described in the above-stated embodiment, and the detailed description thereof is not given. In this embodiment, a bank decoder 12C, a command decoder 14C, a bank control circuit 24C and a core control circuit 26C are different from FIG. 1. The semiconductor memory MEM has a mode terminal MODE and eight banks BK0-7. Each of the banks BK0-7 does not have the refresh control circuit 22 in FIG. 1, but has a mode control circuit 30C. The other constitution is the same as that of the above-stated FIG. 1. The semiconductor memory MEM is, for example, mounted on the system SYS as illustrated in FIG. 6.

The bank decoder 12C outputs the bank signal BNKZ (any of the BNK0Z-BNK7Z) in accordance with the bank address signals BA (BA0-2) in three bits. The bank signals BNK0Z-BNK7Z are respectively activated into high level when the banks BK0-7 are selected.

The command decoder 14C has a function to output a read command signal RDAPZ and a write command signal WRAPZ in addition to the functions of the command decoder 14 in FIG. 1. The read command signal RDAPZ is output when the read operation accompanied by an auto-precharge operation is executed. The write command signal WRAPZ is output when the write operation accompanied by the auto-precharge operation is executed. Details of the bank control circuit 24C, the mode control circuit 30C and the core control circuit 26C are illustrated in FIG. 21.

Figure 21:
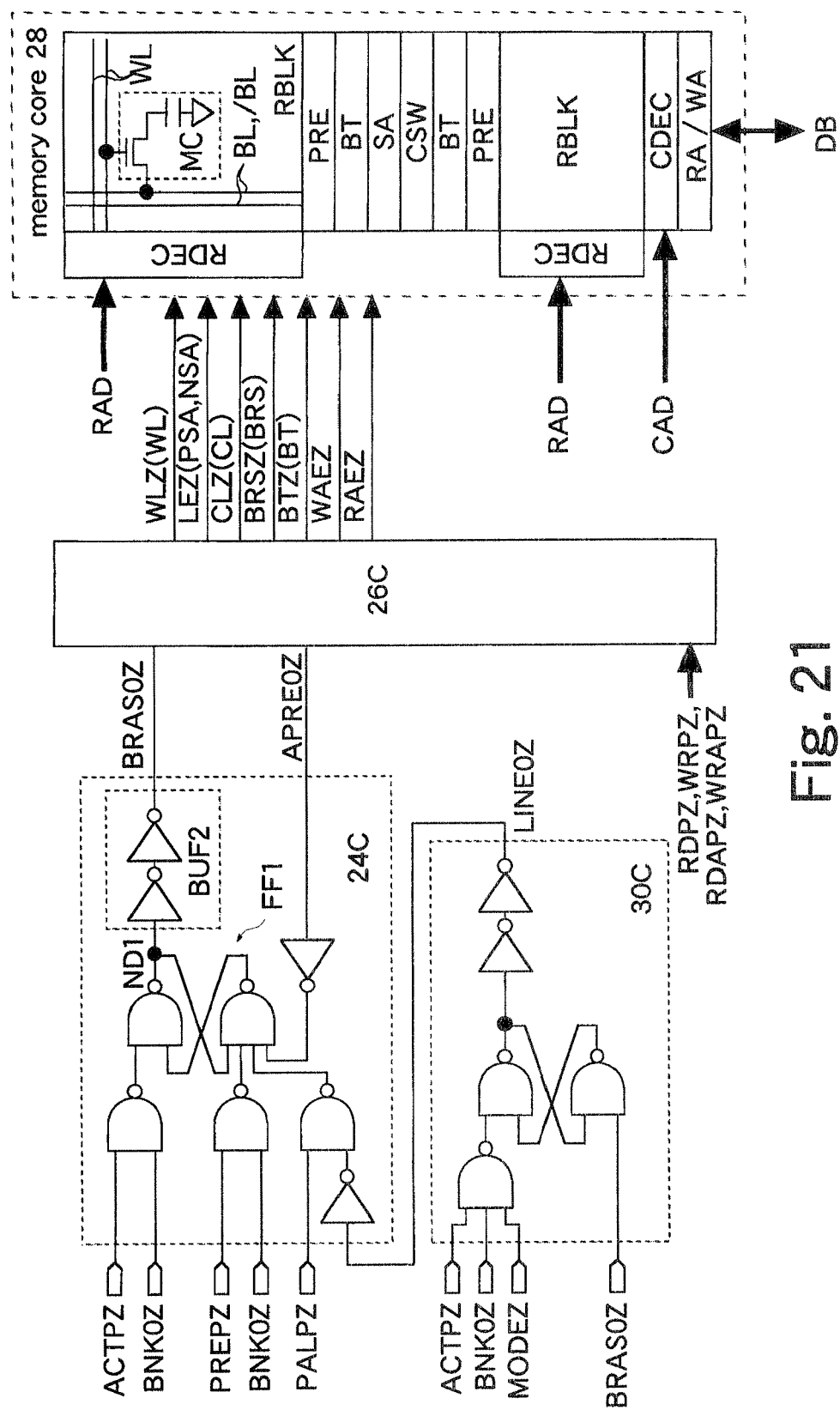
FIG. 21 illustrates details of a bank illustrated in FIG. 20.

FIG. 21 illustrates details of the bank BK0 illustrated in FIG. 20. The banks BK1-7 are the same as FIG. 21 except that the numerals in signal names are different. The mode control circuit 30C activates a line signal LINE0Z into high level in synchronization with the activation command ACT (ACTPZ) when a mode signal MODEZ supplied to the mode terminal MODE in FIG. 20 is in high level (a later-described line operation mode). The mode control circuit 30C maintains the activated state (the low level) of the line signal LINE0Z regardless of the activation command ACT (ACTPZ) when the mode signal MODEZ supplied to the mode terminal MODE in FIG. 20 is in low level (a later-described box operation mode). The mode control circuit 30C inactivates the line signal LINE0Z into low level in synchronization with the inactivation of the basic timing signal BRAS0Z.

The bank control circuit 24C is constituted by increasing logics to reset the flip-flop FF1 of the bank control circuit 24 in FIG. 2. Namely, the flip-flop FF1 has a function to be reset in synchronization with the activation of an auto-precharge signal APRE0Z from the core control circuit 26C in addition to the functions in FIG. 2. The reset of the flip-flop FF1 by the all-precharge command signal PALPZ is masked when the line signal LINE0Z is in high level. Besides, a buffer circuit BUF2 is formed instead of the OR circuit OR1. Namely, the bank control circuit 24C does not receive the refresh signal REF0Z.

The core control circuit 26C is constituted by adding a function of the auto-precharge operation in the read operation and write operation, to the functions of the core control circuit 26 in FIG. 2. The core control circuit 26C activates the auto-precharge signal APRE0Z after the read operation in response to the read command signal RDAPZ is executed, and after the write operation in response to the write command signal WRAPZ is executed.

FIG. 22 illustrates a command specification of the semiconductor memory MEM illustrated in FIG. 20. The command specification of this embodiment is the same as FIG. 5 except that logics of a read command RDA and a write command WRA to which the auto-precharge operation is added are added. Incidentally, the command specification in FIG. 22 may be applied to the above-stated embodiment. In this case, each memory MEM has the command decoder 14C and the core control circuit 26C, and the bank control circuit receives the auto-precharge signal APRE0Z from the core control circuit 26C.

Figure 23:
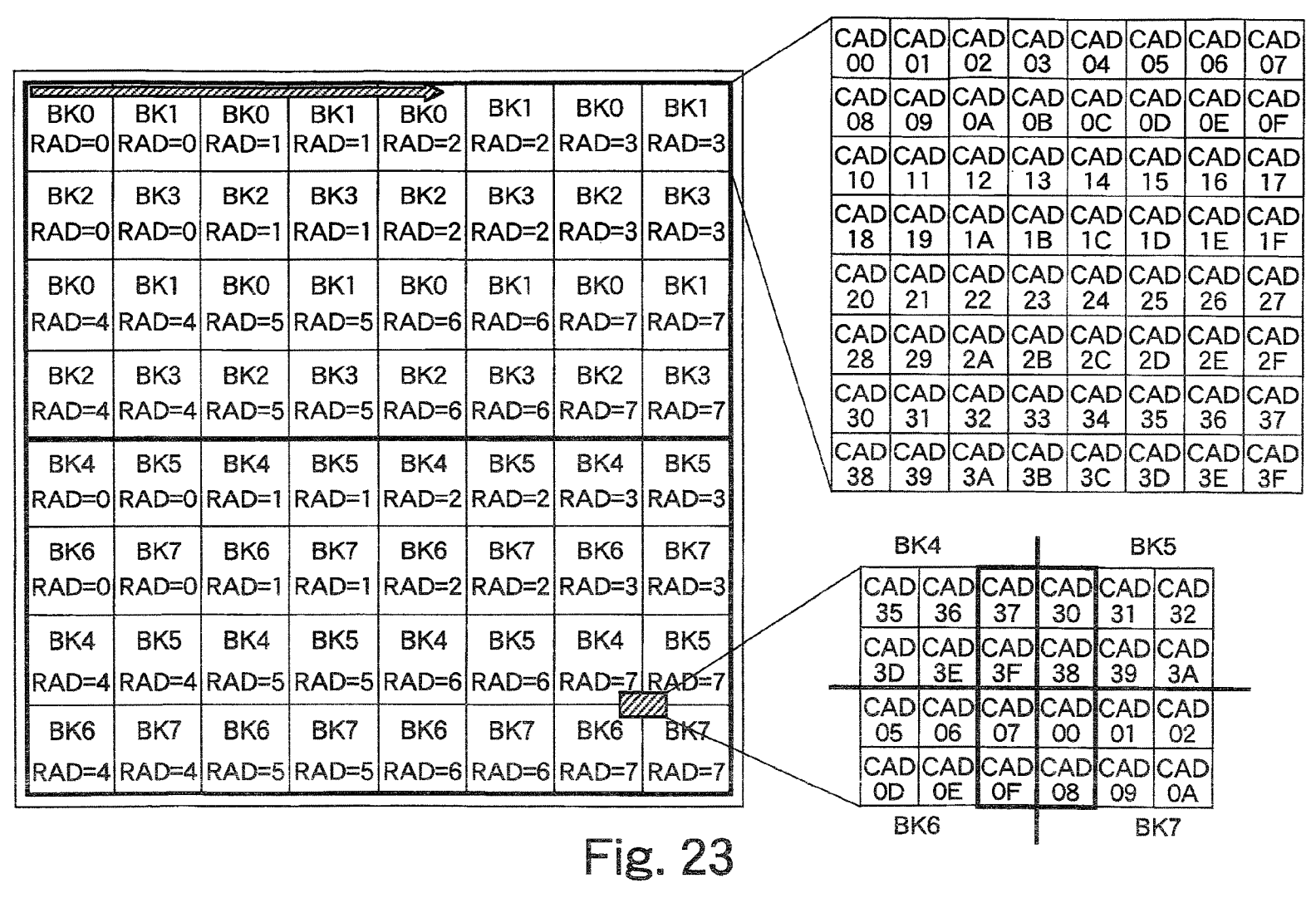

FIG. 23 illustrates an example of a memory map of the semiconductor memory MEM illustrated in FIG. 20. The memory map shown in the drawing is determined by, for example, a design specification of the system SYS illustrated in FIG. 6. In this example, columns of the banks BK0-1, BK2-3 are assigned alternately, and columns of the banks BK4-5, BK6-7 are assigned alternately on the memory map. The column of a pair of banks BK is assigned from a left side to a right side of the drawing by each row address signal RAD. The column address signal CAD is assigned from an upper left side to a lower right side of the drawing. In this example, the banks BK0-3 are assigned to sequentially access the memory map from the left side to the right side. The banks BK4-7 are assigned to access a rectangular area within the memory map.

For example, a screen data displayed on a liquid crystal display of a portable terminal being the system SYS is recorded on the banks BK0-3, and a partial data replacing a part of the liquid crystal display is recorded on the banks BK4-7. The CPU in FIG. 5 executes the line access operation (a line sequential read) at the banks BK0-3, and executes the box access operation reading the data in the rectangular area at the banks BK4-7 as shown by an oblique line arrow and the rectangular area of oblique line in FIG. 23.

Figure 24:
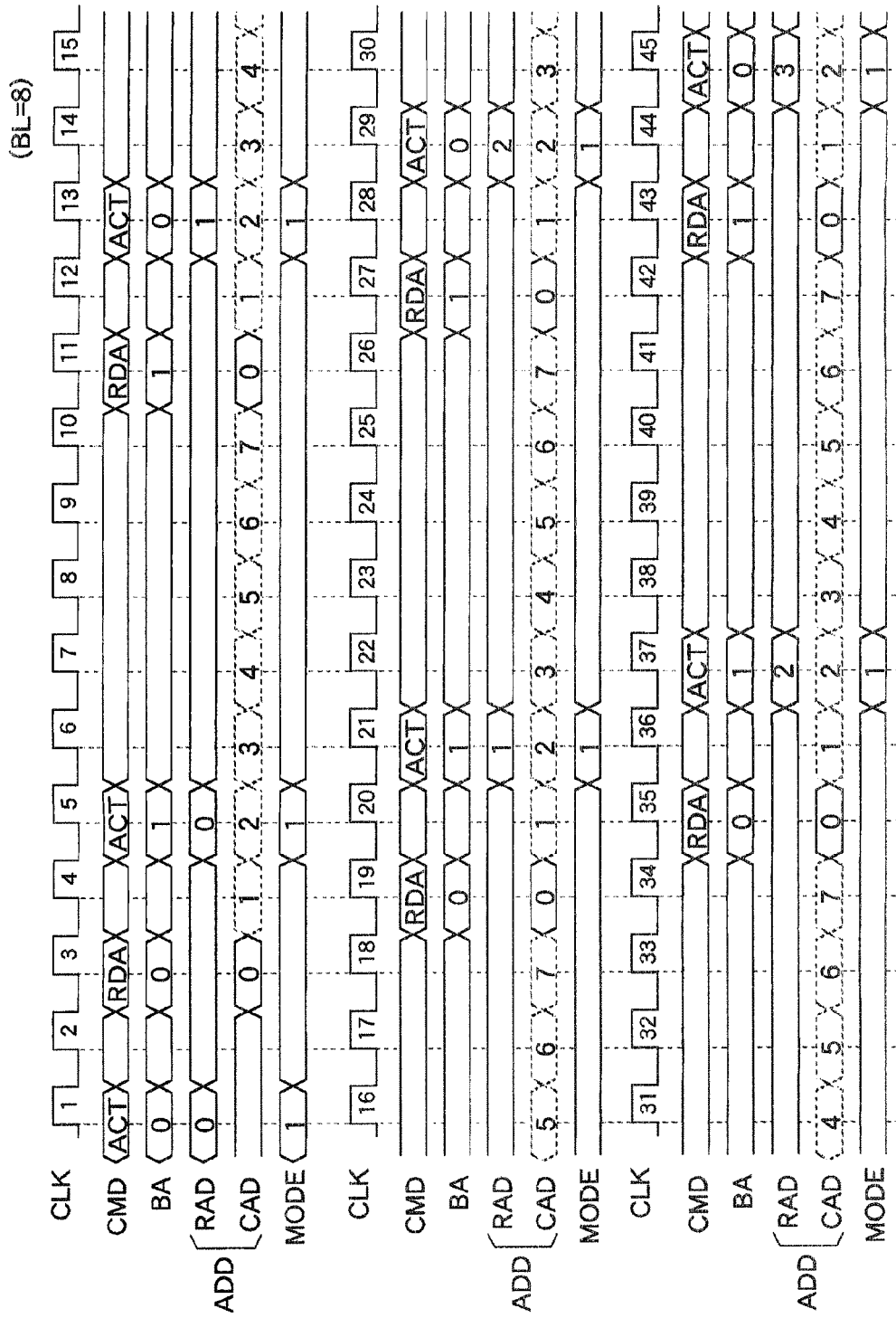
FIG. 24 illustrates an example of operations of the semiconductor memory illustrated in FIG. 20 in a line operation mode.

FIG. 24 illustrates an example of operations of the semiconductor memory MEM illustrated in FIG. 20 in the line operation mode. In this example, the line access operation is executed along the oblique line arrow in FIG. 23. The memory MEM operates in the line operation mode when a high level "1" is supplied to the mode terminal MODE together with the activation command ACT.

In this example, the activation commands ACT are sequentially supplied together with the mode signal MODEZ in high level "1" to execute the line access operation of the banks BK0-1, and the read commands RDA are sequentially supplied. A burst length BL is "8", and therefore, the read operations are executed for eight times by each read command RDA. The column address signals CAD shown by dotted lines in the drawing are generated inside the memory MEM. The row address signal RAD is increased sequentially, and the line access operation is executed. The column address signals CAD shown by the dotted line frames are address signals generated by a column address counter inside the memory MEM at the burst operation time, and they are not supplied from outside.

Figure 25:
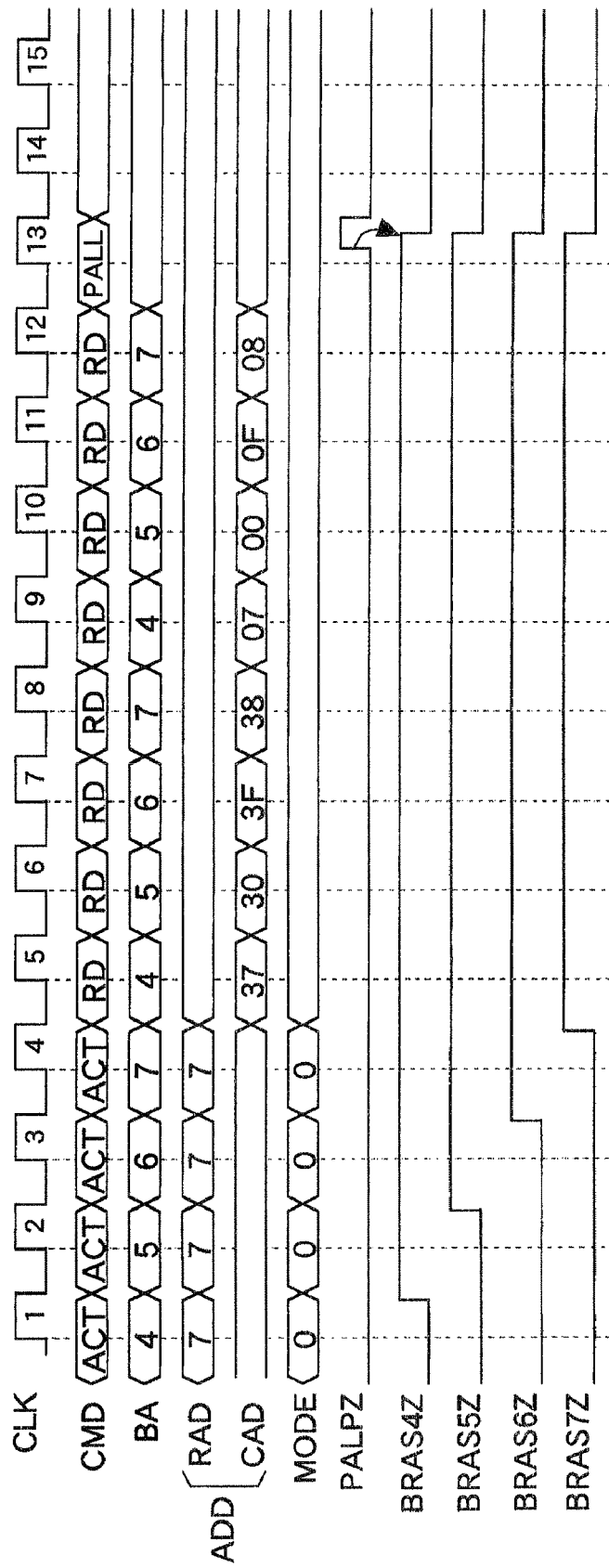
FIG. 25 illustrates an example of operations of the semiconductor memory illustrated in FIG. 20 in a box operation mode.

FIG. 25 illustrates an example of operations of the semiconductor memory MEM illustrated in FIG. 20 in the box operation mode. In this example, a box access operation is executed for the oblique line rectangular frame in FIG. 23. The rectangular area illustrated in FIG. 23 spreads over the banks BK4-7, and therefore, the activation commands ACT are sequentially supplied together with the mode signal MODEZ in low level "0" to execute the box access operation of the banks BK4-7. The memory MEM operates in the box operation mode when the low level "0" is supplied to the mode terminal MODE together with the activation command ACT. After this, the read commands RD of the banks BK4-7 are sequentially supplied. The all-precharge command PALL is supplied after the read operation of the rectangular area is completed. The basic timing signals BRAS4Z-BRAS7Z of the banks BK4-7 are activated in response to the corresponding activation commands ACT, and inactivated in synchronization with the all-precharge command PALL.

Figure 26:
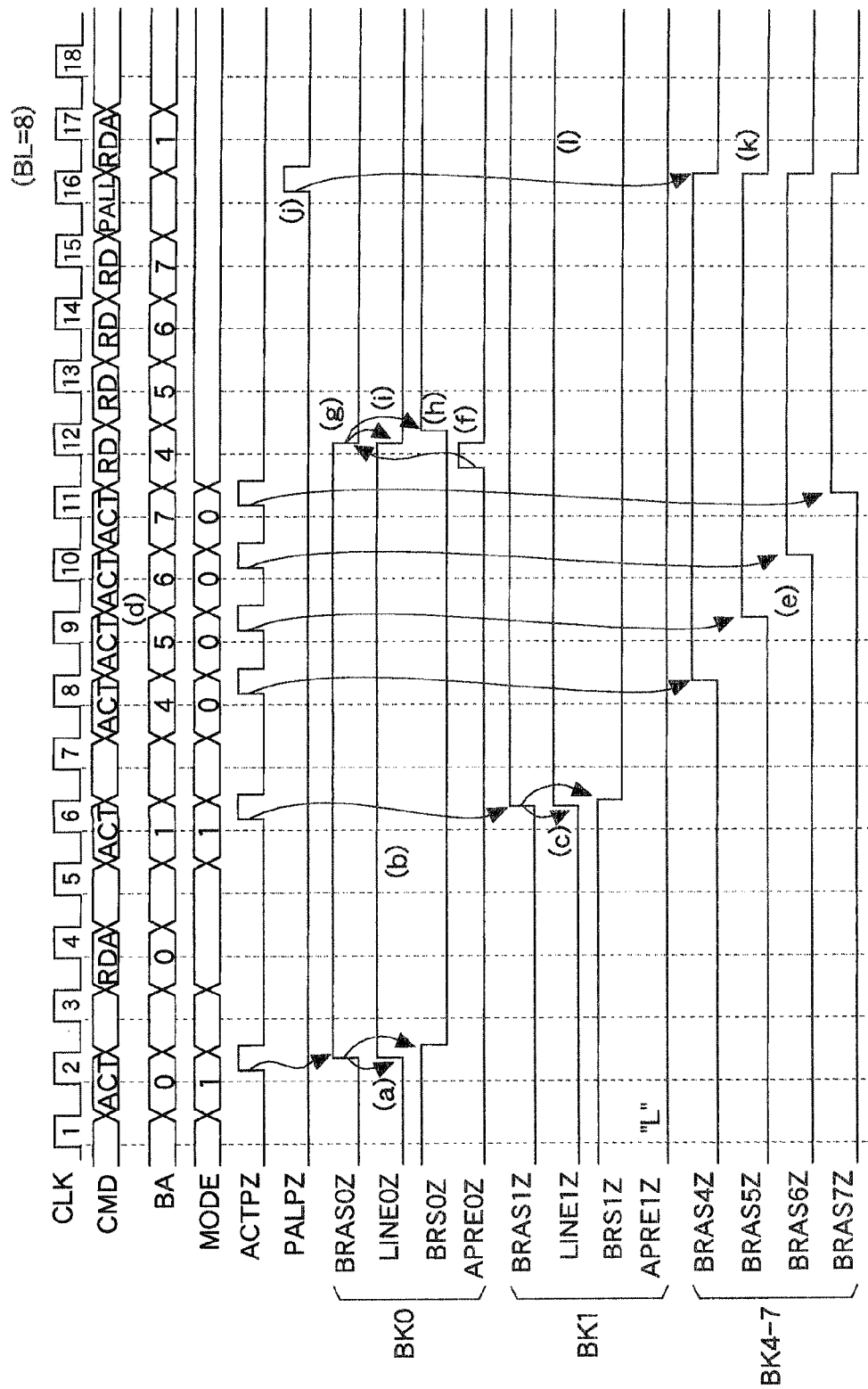
FIG. 26 illustrates an example of operations of the semiconductor memory illustrated in FIG. 20 in the line operation mode and the box operation mode.

FIG. 26 illustrates an example of operations of the semiconductor memory MEM illustrated in FIG. 20 in the line operation mode and the box operation mode. In this example, the box access operation of the banks BK4-7 is executed during the line access operation of the banks BK0-1. Further, the all-precharge command PALL is supplied to the memory MEM to complete the box access operation during the line access operation of the bank BK1.

At first, the mode control circuit 30C (BK0) illustrated in FIG. 21 activates the line signal LINE0Z in response to the activation command ACT of the bank BK0 (FIG. 26 (a)). Next, the read command RDA of the bank BK0 is supplied, and a burst read operation is executed over the clock cycles 4-11 (FIG. 26 (b)). The mode control circuit 30C (BK1) activates the line signal LINE1Z in response to the activation command ACT of the bank BK1 (FIG. 26 (c)). The activation commands of the banks BK4-7 are supplied during the burst read operation of the bank BK0 (FIG. 26 (d)). The bank control circuits 24C of the respective banks BK4-7 activate the basic timing signals BRAS4Z-7Z in synchronization with the activation commands ACT (FIG. 26 (e)).

The core control circuit 26C (BK0) activates the auto-precharge signal APRE0Z in synchronization with the completion of the burst read operation of the bank BK0 (FIG. 26 (f)). The bank control circuit 24C (BK0) inactivates the basic timing signal BRAS0Z in synchronization with the auto-precharge signal APRE0Z (FIG. 26 (g)). The core control circuit 26C (BK0) activates the precharge control signal BRS0Z in synchronization with the inactivation of the basic timing signal BRAS0Z, and executes the precharge operation of the bank BK0 (FIG. 26 (h)). Namely, the auto-precharge operation is executed. The mode control circuit 30C (BK0) inactivates the line signal LINE0Z in synchronization with the inactivation of the basic timing signal BRAS0Z (FIG. 26 (i)). The read operation of the one row address signal RAD of the bank BK0 is then completed.

Next, the all-precharge command PALL is supplied in accordance with the completion of the box access operation, and the all-precharge command signal PALPZ is activated (FIG. 26 (j)). The mode control circuits 30C of the banks BK4-7 inactivate the line signals LINE4Z-7Z. Accordingly, the bank control circuits 24C (BK4-7) reset the flip-flops FF1 in response to the all-precharge command signal PALPZ, and inactivate the basic timing signals BRAS4Z-7Z (FIG. 26 (k)). As a result, the precharge operations of the banks BK4-7 are executed.

On the other hand, the bank control circuit 24C of the bank BK1 receiving the high level line signal LINE1Z masks the reset of the flip-flop FF1 by the all-precharge command signal PALPZ. Concretely speaking, an NAND gate receiving the all-precharge command signal PALPZ and an inverter receiving the line signal LINE1Z in the bank control circuit 24C of the bank BK1 executing the line access operation operate as an inactivation disable circuit disabling the inactivation of the precharge control signal BRS1Z responding to the all-precharge command PALL. Accordingly, the basic timing signal BRAS1Z is not reset, and the activation operation of the bank BK1 continues (FIG. 26 (l)).

As stated above, it is possible to obtain the similar effect to the above-stated embodiments also in this embodiment. Further, it is possible to determine the memory core requiring the termination of the precharge operation without receiving an external signal in accordance with the operation state of the memory core, in the memory MEM to which the line operation command and the box operation command are supplied. The access efficiency improves because unnecessary supplies of the precharge command PRE can be prevented. Namely, the performance of the system SYS can be improved.

Figure 27:
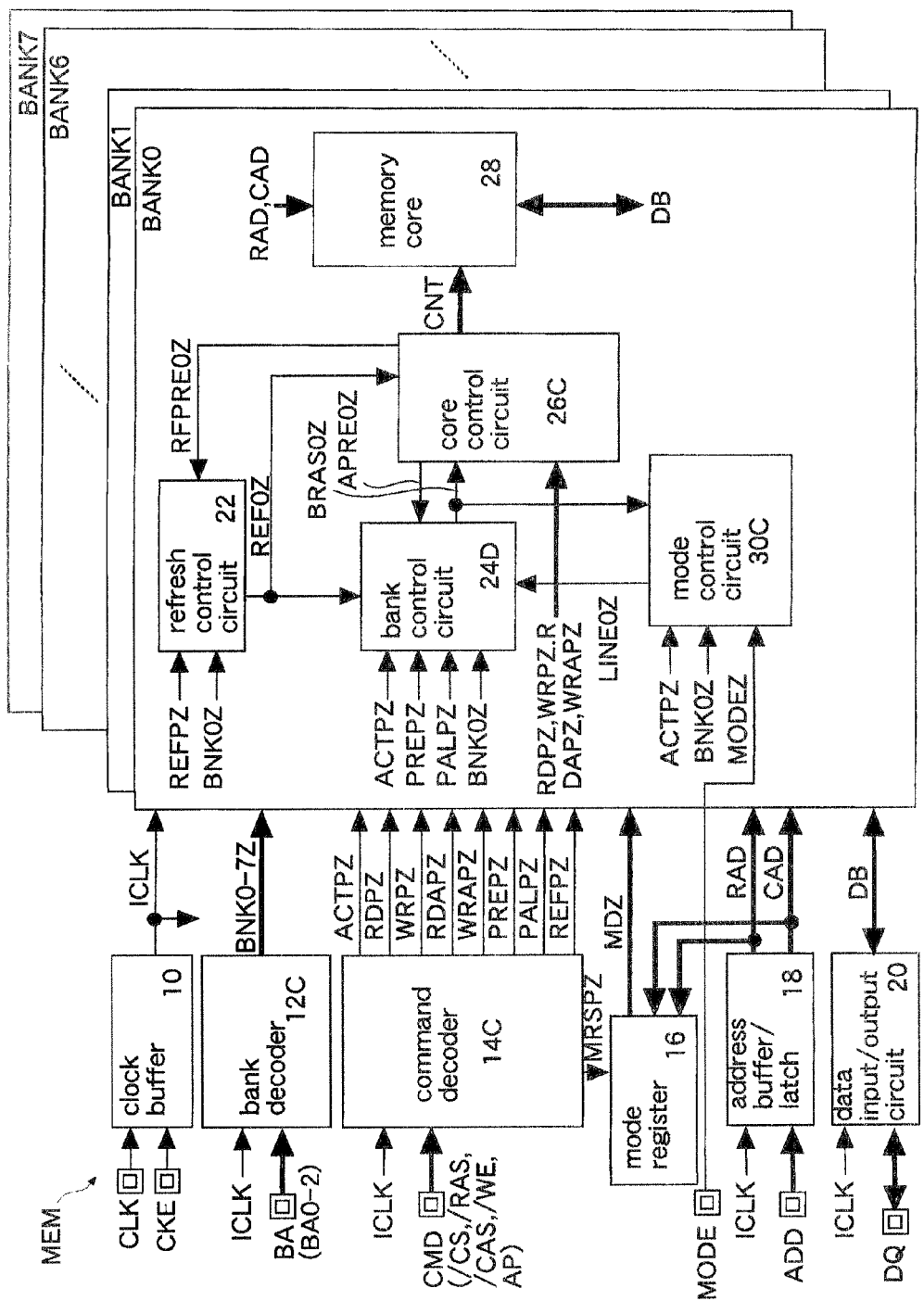
FIG. 27 illustrates yet another embodiment.

FIG. 27 illustrates yet another embodiment. The same reference numerals and symbols are used for the same elements as the elements described in the above-stated embodiment, and a detailed description thereof is not given. In this embodiment, a bank control circuit 24D and a core control circuit 26D are different from FIG. 20. Further, the refresh control circuits 22 are added to the respective banks BK0-7 of the memory MEM in FIG. 20. The other constitution is the same as the above-stated FIG. 20 to FIG. 23.

Figure 28:
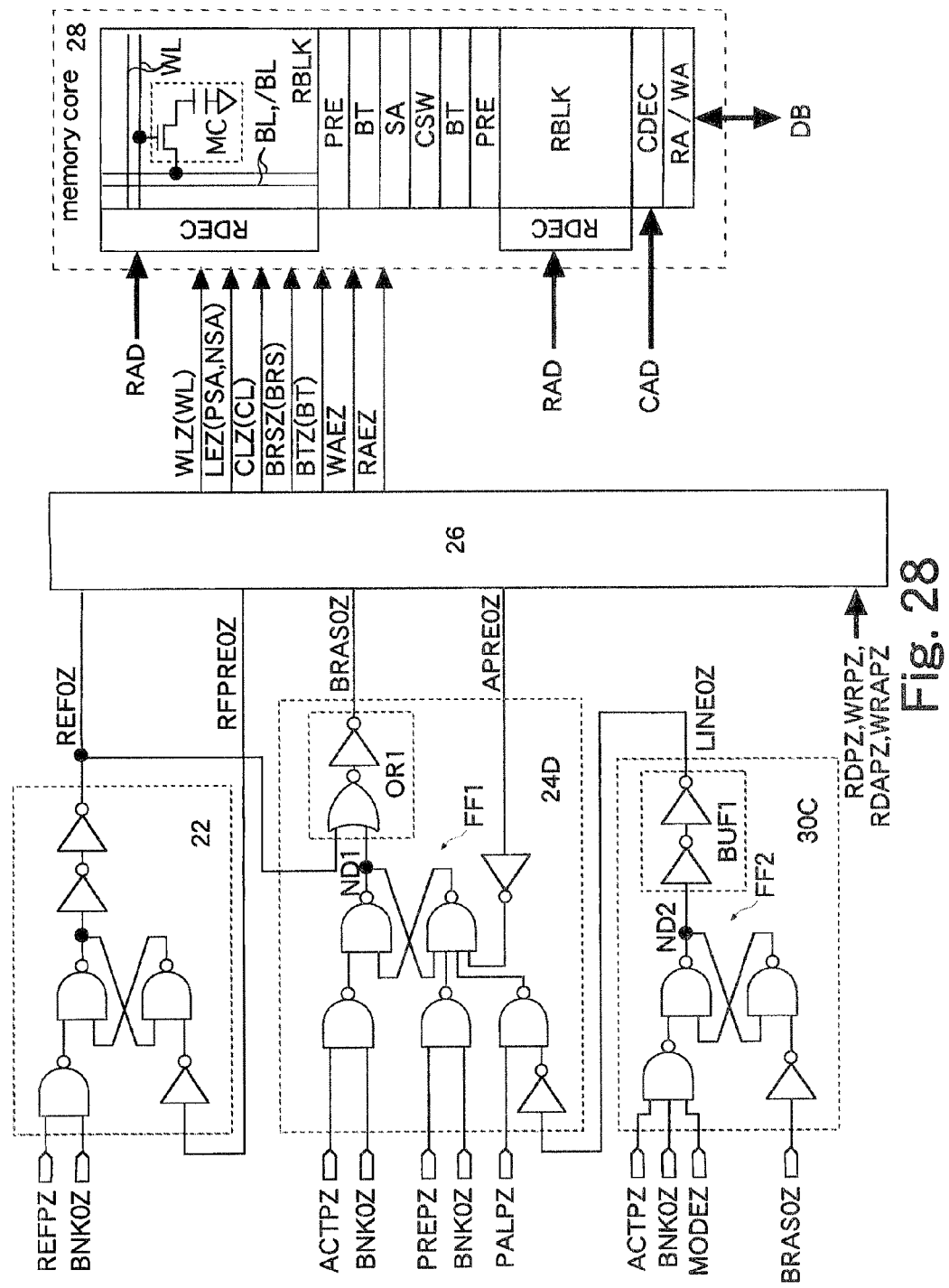
FIG. 28 illustrates details of a bank illustrated in FIG. 27.

FIG. 28 illustrates details of the bank BK0 illustrated in FIG. 27. The banks BK1-7 are the same as FIG. 28 except that the numerals in signal names are different. The bank control circuit 24D has the OR circuit OR1 instead of the buffer circuit BUF2 of the bank control circuit 24C in FIG. 21. The other constitution is the same as the bank control circuit 24C. The core control circuit 26D is constituted by adding a function to control the refresh operation to the core control circuit 26C in FIG. 21.

The OR circuit OR1 is arranged at the bank control circuit 24D, and thereby, it becomes possible to prevent that the bank BK executing the refresh operation starts the precharge operation by the all-precharge command PALL.

Figure 29:
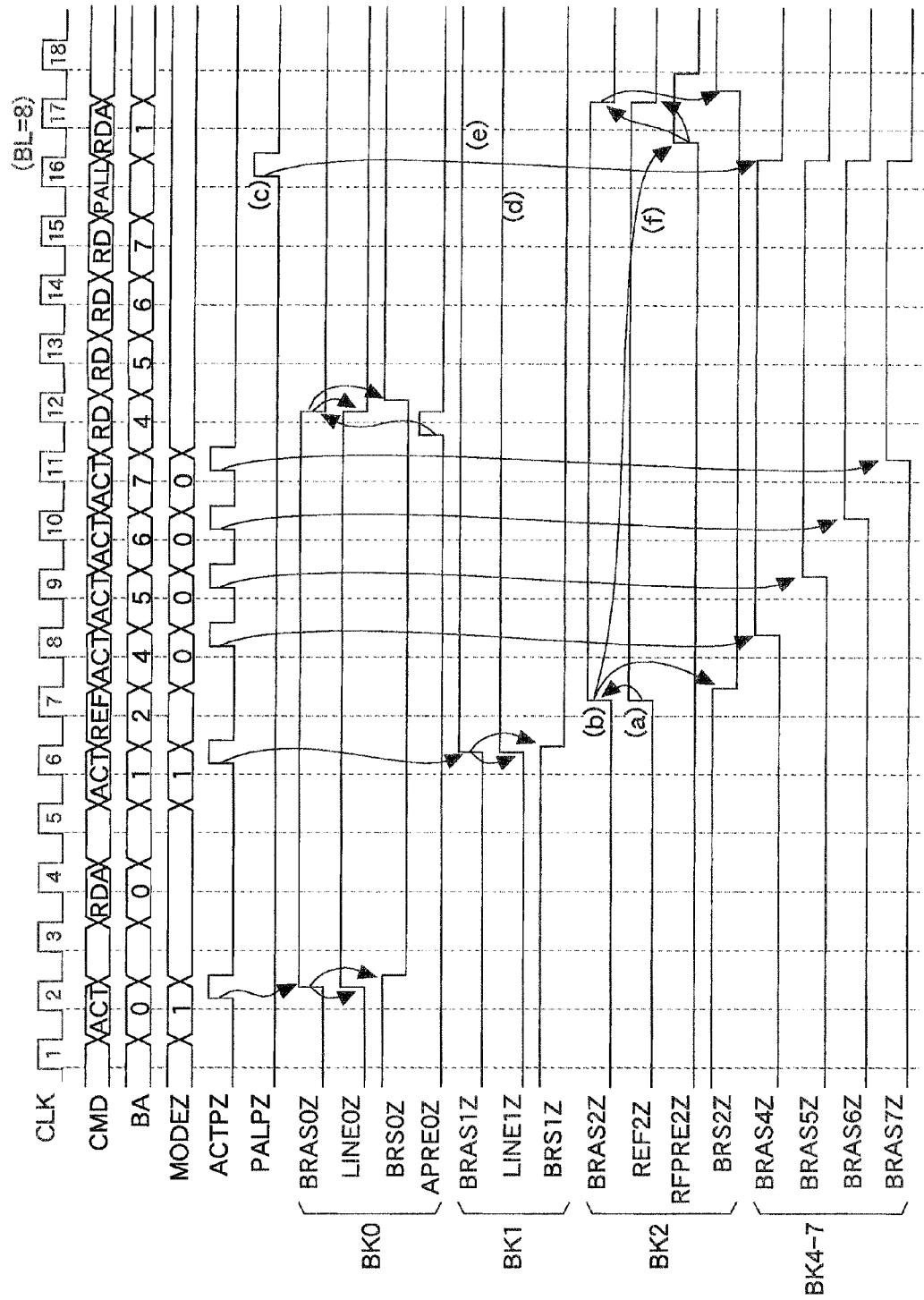
FIG. 29 illustrates an example of operations of a semiconductor memory illustrated in FIG. 27 in the line operation mode and the box operation mode.

FIG. 29 illustrates an example of operations of the semiconductor memory MEM illustrated in FIG. 27 in the line operation mode and the box operation mode. In this example, the refresh command REF of the bank BK2 is supplied before the activation command ACT of the bank BK4 is supplied. The other operations are the same as those in FIG. 26. The refresh control circuit 22 (BK2) activates the refresh signal REF2Z in response to the refresh command REF (FIG. 29 (a)). The bank control circuit 24D (BK2) activates the basic timing signal BRAS2Z in response to the refresh signal REF2Z (FIG. 29 (b)). The refresh operation of the bank BK2 is then started.

Next, the all-precharge command PALL is supplied, and the all-precharge command signal PALPZ is activated (FIG. 29 (c)). At this time, the line access operation of the bank BK1 is still during execution, and the line signal LINE1Z is activated (FIG. 29 (d)). Accordingly, the flip-flop FF1 being reset and the basic timing signal BRAS1Z being inactivated are disabled at the bank control circuit 24D of the bank BK1 (FIG. 29 (e)). As stated above, an NAND gate receiving the all-precharge command signal PALPZ and an inverter receiving the line signal LINE1Z at the bank control circuit 24D of the bank BK1 executing the line access operation operate as an inactivation disable circuit disabling the inactivation of the precharge control signal BRS1Z responding to the all-precharge command PALL to terminate the line access operation.

Similarly, the refresh operation of the bank BK2 is still during execution when the all-precharge command PALL is supplied (FIG. 29 (f)). Accordingly, the basic timing signal BRAS2Z is not inactivated even if the all-precharge command signal PALPZ is activated and the flip-flop FF2 of the bank control circuit 24D (BK2) is reset. As stated above, the OR circuit OR1 of the bank control circuit 24D of the bank BK2 executing the refresh operation operates as an inactivation disable circuit disabling the inactivation of the precharge control signal BRS2Z responding to the all-precharge command PALL to terminate the refresh operation.

Figure 30:
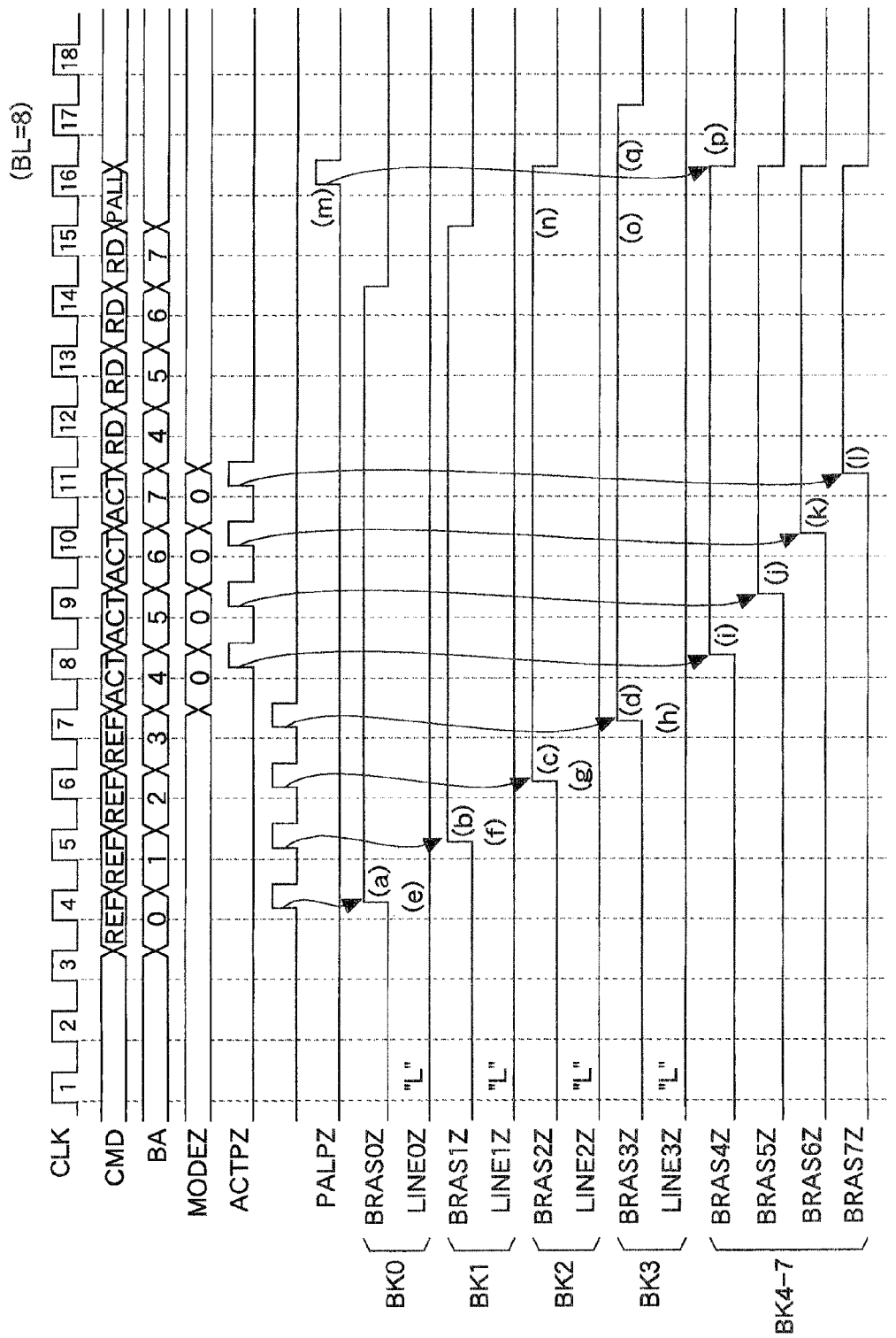
FIG. 30 illustrates an example of the other operations of the semiconductor memory illustrated in FIG. 27 in the box operation mode.

FIG. 30 illustrates an example of another operation of the semiconductor memory MEM illustrated in FIG. 27 in the box operation mode. In this example, at first, the refresh commands REF of the banks BK0-3 are sequentially supplied, and the basic timing signals BRAS0Z-3Z are sequentially activated (FIG. 30 (a, b, c, d)). The mode control circuits 30C (BK0-3) keep the line signals LINE0Z-3Z in low level regardless of the level of the mode signal MODEZ because the activation command signal ACTPZ is in low level (FIG. 30 (e, f, g, h)).

Next, the activation commands ACT of the banks BK4-7 are sequentially supplied, and the basic timing signals BRAS4Z-7Z of the banks BK4-7 are sequentially activated (FIG. 30 (i, j, k, i)). After that, the read commands RD of the banks BK4-7 are supplied, and the box access operations (the read operations) are sequentially executed. After the box access operations are completed, the all-precharge command PALL is supplied, and the all-precharge command signal PALPZ is activated (FIG. 30 (m)). The refresh operations of the banks BK0-2 are completed when the all-precharge command PALL is supplied (FIG. 30 (n)). The bank BK3 is executing the refresh operation (FIG. 30 (o)). The bank control circuits 24D of the banks BK4-7 inactivate the basic timing signals BRAS4Z-7Z in synchronization with the all-precharge command signal PALPZ because the line signals LINE4Z-7Z and the refresh signals REF4Z-7Z are in low level (FIG. 30 (p)). The bank control circuit 24D of the bank BK3 resets the flip-flop FF1 when the line signal LINE3Z is in low level. However, the inactivation of the basic timing signal BRAS3Z by the reset of the flip-flop FF1 is disabled because the high level refresh signal REF3Z is received at the OR circuit OR1 (FIG. 30 (q)).

As stated above, it is possible to obtain the similar effect to the above-stated embodiments also in this embodiment. Further, it is possible to determine the memory core 28 requiring the termination of the precharge operation without receiving an external signal in accordance with the operation state of the memory core 28, in the memory MEM to which the refresh command, the line operation command, and the box operation command are supplied. The access efficiency improves because the unnecessary supply of the precharge command PRE can be prevented. Namely, the performance of the system SYS can be improved.

Incidentally, examples in which the above-stated embodiments are applied to the SDRAM are described. However, for example, the above-stated embodiments may be applied to a DRAM in a clock asynchronous type. Otherwise, the above-stated embodiments may be applied to an FCRAM (Fast Cycle RAM) of an SDRAM type.

In the above-stated embodiments, examples in which the read commands RD, RDA are supplied are described. However, for example, the same effect can also be obtained if the write commands WR, WRA are supplied. Further, the same effect can be obtained if the read commands RD, RDA and the write commands WR, WRA are supplied in a mixed state.

A proposition of the embodiments is to terminate the operation of only the memory core requiring the termination of operation without specifying the memory core from outside.

Another proposition of the embodiments is to terminate the operation of only the memory core requiring the termination of operation while maintaining a compatibility of a command input specification.

For example, the semiconductor memory is mounted on a system together with a controller accessing the semiconductor memory. The termination of the operation in response to the termination command is judged in accordance with an operation state of the memory core. It is possible to terminate the operation of the memory core requiring the termination of operation without specifying the memory core from outside. It is possible to terminate the operation of only the memory core requiring the termination of operation while maintaining a compatibility of a command input specification because information to specify the memory core of which operation is to be terminated is not necessary.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory, comprising:
a plurality of memory cores having memory cells; and
an operation control circuit starting a first operation of any of the memory cores in response to a first operation command, starting a second operation of any of the memory cores in response to a second operation command, and terminating the first operation and disabling a termination of the second operation in response to a termination command to terminate operations of both the plurality of memory cores during execution of both the first operation and the second operation, wherein
the operation control circuit includes an access control circuit in each of the memory cores, and wherein
the access control circuit each includes:
an activation circuit activating an access signal in response to the first or second operation command to start the first operation or the second operation of a corresponding memory core;
an inactivation circuit inactivating the access signal in response to the termination command to terminate the first operation when the corresponding memory core executes the first operation;
an inactivation disable circuit disabling an inactivation of the access signal in response to the termination command to terminate the second operation when the corresponding memory core executes the second operation; and
a disable invalidating circuit invalidating a disable operation of the inactivation disable circuit to terminate the second operation in response to the termination command when a mask signal is received.

2. The semiconductor memory according to claim 1, further comprising:

a register being set in accordance with an external input, and outputting the mask signal in accordance with a set value.

3. A semiconductor memory, comprising:
a plurality of memory cores having memory cells;
an operation control circuit starting a first operation of any of the memory cores in response to a first operation command, starting a second operation of any of the memory cores in response to a second operation command, and terminating the first operation and disabling a termination of the second operation in response to a termination command to terminate operations of the plurality of memory cores during execution of both the first operation and the second operation; and
a command input circuit receiving the first and second operation commands, a first termination command being the termination command, and a second termination command, wherein
the operation control circuit includes an access control circuit in each of the memory cores, and wherein
the access control circuit each includes:
an activation circuit activating an access signal in response to the first or second operation command to start the first operation or the second operation of a corresponding memory core;
an inactivation circuit inactivating the access signal in response to the termination command to terminate the first operation when the corresponding memory core executes the first operation;
an inactivation disable circuit disabling an inactivation of the access signal in response to the termination command to terminate the second operation when the corresponding memory core executes the second operation; and
a disable invalidating circuit invalidating a disable operation of the inactivation disable circuit to terminate the first and second operations in response to the second termination command when the second termination command is received.

4. The semiconductor memory according to claim 1, wherein
the first and second operation commands are an activation command and a refresh command, wherein
the first operation is an activation operation setting a corresponding memory core into activated state, wherein
the second operation is a refresh operation refreshing the memory cells of the corresponding memory core, and wherein
the termination command is a precharge command inactivating the memory cores in activated state.

5. The semiconductor memory according to claim 4, wherein
the termination command is an all-precharge command inactivating all memory cores which are during activation operations.

6. The semiconductor memory according to claim 1, wherein
the first and second operation commands are a box operation command and a line operation command, wherein
the first operation is a box access operation accessing a rectangular area within a memory map assigned to one of the memory cores, wherein
the second operation is a line access operation accessing a line area within the memory map assigned to one of the memory cores, and wherein
the termination command is a precharge command inactivating the memory cores in activated state.

7. The semiconductor memory according to claim 1, wherein
the first and second operation commands are a box operation command and a refresh command, wherein
the first operation is a box access operation accessing a rectangular area within a memory map assigned to one of the memory cores, wherein
the second operation is a refresh operation refreshing the memory cells of a corresponding memory core, and wherein
the termination command is a precharge command inactivating the memory cores in activated state.

8. An operating method of a semiconductor memory including a plurality of memory cores having memory cells, comprising:
activating an access signal in response to a first operation command and starting a first operation of any of the memory cores;
activating the access signal in response to a second operation command and starting a second operation of any of the memory cores;
terminating the first operation and disabling termination of the second operation in response to a termination command to terminate operations of the plurality of memory cores during execution of both the first operation and the second operation;
inactivating the access signal in response to the termination command to terminate the first operation when the corresponding memory core is executing the first operation;
disabling an inactivation of the access signal responding to the termination command to terminate the second operation when the corresponding memory core is executing the second operation; and
invalidating a disable operation of the inactivation of the access signal responding to the termination command when a mask signal is received.

9. The operating method of the semiconductor memory according to claim 8, further comprising:
disabling the inactivation of the access signal of the memory cores executing the second operation when a first termination command being the termination command is received, and
invalidating a disable operation of the inactivation of the access signal to terminate the first and second operations in response to a second termination command when the second termination command is received.

10. A system including a semiconductor memory and a controller outputting a first operation command, a second operation command and a termination command to access the semiconductor memory, wherein
the semiconductor memory includes:
a plurality of memory cores having memory cells; and
an operation control circuit starting a first operation of any of the memory cores in response to a first operation command, starting a second operation of any of the memory cores in response to a second operation command, and terminating the first operation and disabling a termination of the second operation in response to a termination command to terminate operations of the plurality of memory cores during execution of both the first operation and the second operation, wherein
the operation control circuit includes an access control circuit in each of the memory cores, and wherein the access control circuit each includes:

an activation circuit activating an access signal in response to the first or second operation command to start the first operation or the second operation of a corresponding memory core;

an inactivation circuit inactivating the access signal in response to the termination command to terminate the first operation when the corresponding memory core executes the first operation;

an inactivation disable circuit disabling an inactivation of the access signal in response to the termination command to terminate the second operation when the corresponding memory core executes the second operation; and a disable invalidating circuit invalidating a disable operation of the inactivation disable circuit to terminate the second operation in response to the termination command when a mask signal is received.

11. The system according to claim 10, comprising:

a register being set in accordance with an external input, and outputting the mask signal in accordance with a set value.

12. A system including a semiconductor memory and a controller outputting a first operation command, a second operation command and a termination command to access the semiconductor memory, wherein the semiconductor memory includes:

a plurality of memory cores having memory cells;

an operation control circuit starting a first operation of any of the memory cores in response to a first operation command, starting a second operation of any of the memory cores in response to a second operation command, and terminating the first operation and disabling a termination of the second operation in response to a termination command to terminate operations of the plurality of memory cores during execution of both the first operation and the second operation; and a command input circuit receiving the first and second operation commands, a first termination command being the termination command, and a second termination command, wherein the operation control circuit includes an access control circuit in each of the memory cores, and wherein the access control circuit each includes:

an activation circuit activating an access signal in response to the first or second operation command to start the first operation or the second operation of a corresponding memory core;

an inactivation circuit inactivating the access signal in response to the termination command to terminate the first operation when the corresponding memory core executes the first operation;

an inactivation disable circuit disabling an inactivation of the access signal in response to the termination command to terminate the second operation when the corresponding memory core executes the second operation; and a disable invalidating circuit invalidating a disable operation of the inactivation disable circuit to terminate the first and second operations in response to the second termination command when the second termination command is received.

* * * * *